(12) United States Patent
Noudo

(10) Patent No.: US 11,805,324 B2
(45) Date of Patent: Oct. 31, 2023

(54) IMAGING DEVICE AND IMAGE-CAPTURING APPARATUS

(71) Applicant: SONY SEMICONDUCTOR SOLUTIONS CORPORATION, Kanagawa (JP)

(72) Inventor: Shinichiro Noudo, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 118 days.

(21) Appl. No.: 17/041,957

(22) PCT Filed: Jan. 17, 2019

(86) PCT No.: PCT/JP2019/001255
§ 371 (c)(1),
(2) Date: Sep. 25, 2020

(87) PCT Pub. No.: WO2019/193809
PCT Pub. Date: Oct. 10, 2019

(65) Prior Publication Data
US 2021/0136283 A1    May 6, 2021

(30) Foreign Application Priority Data
Apr. 5, 2018  (JP) ................. 2018-072886

(51) Int. Cl.
*H04N 23/80* (2023.01)
*H01L 27/146* (2006.01)
*H04N 25/60* (2023.01)

(52) U.S. Cl.
CPC ......... *H04N 23/80* (2023.01); *H01L 27/1461* (2013.01); *H01L 27/14605* (2013.01); *H04N 25/60* (2023.01)

(58) Field of Classification Search
None
See application file for complete search history.

(56) References Cited

U.S. PATENT DOCUMENTS 8,810,703 B2 *   8/2014   Machida ........... H01L 27/14623
                                                      348/308
2005/0018064 A1   1/2005   Itoh
(Continued)

FOREIGN PATENT DOCUMENTS

EP   1592066 B1    5/2011
JP   H10-275906   10/1998
(Continued)

OTHER PUBLICATIONS

International Search Report and Written Opinion prepared by the Japanese Patent Office dated Mar. 26, 2019, for International Application No. PCT/JP2019/001255.

*Primary Examiner* — James M Hannett
(74) *Attorney, Agent, or Firm* — Sheridan Ross PC

(57) ABSTRACT

To suppress entrance of incident light into a charge holding section in a pixel to prevent a reduction in image quality. An imaging device includes a pixel array. The pixel array includes a plurality of pixels each including a photoelectric converter that generates a charge depending on incident light, a charge holding section that holds the generated charge, and a charge transfer section that transfers the generated charge to the charge holding section, each of the plurality of pixels generating an image signal depending on the held charge. The charge holding section or the charge transfer section in each of the plurality of pixels is arranged close to an optical center of the pixel array with respect to the incident light.

12 Claims, 17 Drawing Sheets

(56) References Cited

U.S. PATENT DOCUMENTS

| | | | |
|---|---|---|---|
| 2011/0234836 A1* | 9/2011 | Machida | H04N 5/37452 |
| | | | 348/222.1 |
| 2013/0070131 A1 | 3/2013 | Ohkubo et al. | |
| 2014/0084142 A1* | 3/2014 | Machida | H01L 27/14603 |
| | | | 250/208.1 |
| 2014/0091415 A1 | 4/2014 | Saito | |
| 2015/0124140 A1 | 5/2015 | Ohkubo et al. | |
| 2016/0006959 A1 | 1/2016 | Machida | |
| 2016/0301887 A1* | 10/2016 | Ichikawa | H01L 27/14614 |
| 2017/0195598 A1 | 7/2017 | Machida | |
| 2017/0244920 A1 | 8/2017 | Ohkubo et al. | |
| 2019/0296060 A1* | 9/2019 | Oh | H01L 27/1463 |

FOREIGN PATENT DOCUMENTS

| | | |
|---|---|---|
| JP | 2004-328671 | 11/2004 |
| JP | 2010-021450 | 1/2010 |
| JP | 2011-103359 | 5/2011 |
| JP | 2011-204878 | 10/2011 |
| JP | 2013-065688 | 4/2013 |
| JP | 2014-072471 | 4/2014 |
| TW | 201143416 A | 12/2011 |

\* cited by examiner

IMAGING DEVICE AND IMAGE-CAPTURING APPARATUS

CROSS REFERENCE TO RELATED APPLICATIONS

This application is a national stage application under 35 U.S.C. 371 and claims the benefit of PCT Application No. PCT/JP2019/001255 having an international filing date of 17 Jan. 2019, which designated the United States, which PCT application claimed the benefit of Japanese Patent Application No. 2018-072886 filed 5 Apr. 2018, the entire disclosures of each of which are incorporated herein by reference.

TECHNICAL FIELD

The present disclosure relates to an imaging device and an image-capturing apparatus. In particular, the present disclosure relates to an imaging device and an image-capturing apparatus, the imaging device including a photoelectric converter that performs photoelectric conversion on incident light and a charge holding section that holds a charge generated by the photoelectric conversion.

BACKGROUND ART

Conventionally, the imaging device includes pixels arranged in a two-dimensional grid, each pixel generating an image signal based on incident light. The pixel includes a photoelectric converter that performs photoelectric conversion on incident light to generate a charge, and a charge holding section that temporarily holds the generated charge. A charge generated by the photoelectric converter during an exposure period is transferred to the charge holding section after a lapse of the exposure period, and is held in the charge holding section. Next, an image signal depending on the charge held in the charge holding section is generated to be output by the pixel. The processing from exposure to output of an image signal is performed for each row of pixels in the two-dimensionally arranged pixels at staggered times in a sequential manner, and this results in being able to generate an image for a single screen. Such an imaging method is referred to as a rolling shutter method. When light incident entering the photoelectric converter enters the charge holding section upon performing the imaging, photoelectric conversion is also performed by the charge holding section. When a charge generated by the photoelectric conversion performed by the charge holding section is superimposed on a charge generated by the photoelectric converter, an error occurs in an image signal, and noise is caused.

In the rolling shutter method described above, a distortion called a focal plane distortion occurs in an image due to a shift in an exposure period for each row. Thus, an imaging method in which exposure is performed in all of the pixels included the imaging device at the same time, is used. Specifically, photoelectric conversion is performed on incident light at the same time in all of the photoelectric converters, and a generated charge is caused to be held in the charge holding section at the same time in all of the pixels. Then, generation and output of an image signal is performed for each row in a sequential manner. Such an imaging method is referred to as a global shutter method, and this makes it possible to perform imaging in which there is a reduction in a focal plane distortion and the like. However, a standby time between transfer of a charge to the charge holding section and generation of an image signal is relatively long, and differs depending on the row, since generation and output of an image signal is performed for each row in a sequential manner. Thus, the charge holding section is more greatly affected by incident light, compared to the case of the rolling shutter method.

From among such imaging devices, a backside-irradiation imaging device in which incident light is irradiated onto a back surface of a semiconductor substrate on which a photoelectric converter is formed, is used, in which a light-blocking portion is embedded between the photoelectric converter and a charge holding section (refer to, for example, Patent Literature 1).

CITATION LIST

Patent Literature

Patent Literature 1: Japanese Patent Application Laid-open No. 2015-228510

DISCLOSURE OF INVENTION

Technical Problem

The related art described above prevents light from entering a charge holding section from a photoelectric converter by arranging a light-blocking portion. This prevents photoelectric conversion from being performed by the charge holding section. However, in the related art described above, an opening is arranged in the light-blocking portion in order to secure a route used to transfer a charge from the photoelectric converter to the charge holding section, and incident light is irradiated onto the charge holding section through the opening. There is a problem in which noise in an image signal is increased and the image quality is reduced.

The present disclosure has been achieved in view of the problems described above, and it is an object of the present disclosure to suppress entrance of incident light into a charge holding section in a pixel, and thus to prevent a reduction in image quality.

Solution to Problem

The present disclosure has been achieved to solve the problems described above, and a first aspect of the present disclosure is an imaging device that includes a pixel array that includes a pixel including a photoelectric converter that generates a charge depending on incident light, a charge holding section that holds the generated charge, and a charge transfer section that transfers the generated charge to the charge holding section, the pixel generating an image signal depending on the held charge, the pixel array including a plurality of the pixels, the charge holding section or the charge transfer section in each of the plurality of the pixels being arranged close to an optical center of the pixel array with respect to the incident light.

Further, in the first aspect, the pixel array may include a plurality of image regions each including a plurality of the pixels, and at least one of the photoelectric converter, the charge holding section, or the charge transfer section in each of the plurality of the pixels in one of the plurality of image regions may be arranged symmetrically to the at least one of the photoelectric converter, the charge holding section, or the charge transfer section in each of the plurality of the pixels in another of the plurality of image regions.

Further, in the first aspect, the plurality of image regions may be adjacently arranged along a line passing through the optical center with respect to the incident light.

Further, in the first aspect, the plurality of image regions may be adjacently arranged along a plurality of the lines each passing through the optical center with respect to the incident light.

Further, in the first aspect, the pixel may further include a light-blocking wall that is arranged between the photoelectric converter and the charge holding section, and blocks the incident light, the light-blocking wall including an opening near the charge transfer section.

Further, in the first aspect, the pixel may further include a second charge holding section that holds the transferred charge, and a second charge transfer section that transfers the charge held in the charge holding section to the second charge holding section, and the pixel may generate an image signal on the basis of the charge held in the second charge holding section.

Further, in the first aspect, a boundary of the plurality of image regions may have a shape different from a linear shape.

Further, in the first aspect, the boundary may have an irregular shape having convex and concave portions, the convex or concave portion being provided for each pixel.

Further, in the first aspect, the boundary may have a shape having convex and concave portions and being formed on the basis of a specified regulation, the convex or concave portion being provided for each pixel.

Further, in the first aspect, each of the plurality of the pixels may further include an on-chip lens that collects the incident light into the photoelectric converter.

Further, in the first aspect, the on-chip lens may be arranged in a state of being shifted with respect to the photoelectric converter according to an incident angle of the incident light.

Further, a second aspect of the present disclosure is an image-capturing apparatus that includes an imaging device that includes a pixel array that includes a pixel including a photoelectric converter that generates a charge depending on incident light, a charge holding section that holds the generated charge, and a charge transfer section that transfers the generated charge to the charge holding section, the pixel generating an image signal depending on the held charge, the pixel array including a plurality of the pixels, the charge holding section or the charge transfer section in each of the plurality of the pixels being arranged close to an optical center of the pixel array with respect to the incident light; and a processing circuit that processes the generated image signal.

Further, in the second aspect, the processing circuit may perform processing of generating a new image signal on the basis of an image signal of the pixel arranged near a boundary of the plurality of regions.

In the pixel array, obliquely inclined incident light enters a pixel arranged away from the optical center with respect to the incident light. The oblique inclination is oriented toward a direction extending from the optical center to a surrounding portion of the pixel array. The adoption of the aspects described above result in incident light obliquely entering in a direction different from a direction of a position at which the charge holding section or the charge transfer section is arranged in the pixel. Entrance of incident light into the charge holding section is expected to be suppressed.

Advantageous Effects of Invention

The present disclosure provides an excellent effect of suppressing entrance of incident light into a charge holding section in a pixel, and thus preventing a reduction in image quality.

MODE(S) FOR CARRYING OUT THE INVENTION

Next, modes for carrying out the present disclosure (hereinafter referred to as embodiments) will be described with reference to the drawings. In the accompanying drawings, the same or similar portions will be denoted by the same or similar reference symbols. However, the figures are schematic ones, and, for example, a ratio of dimensions of respective components is not necessarily the same as the actual one. Further, of course, a certain figure and another figure have different dimensional relationships and different ratios of dimensions with respect to the same portion. Moreover, the embodiments will be described in the following order.
1. First Embodiment
2. Second Embodiment
3. Third Embodiment
4. Fourth Embodiment
5. Fifth Embodiment
6. Example of Application to Camera 1. First Embodiment

[Configuration of Imaging Device]

Figure 1:
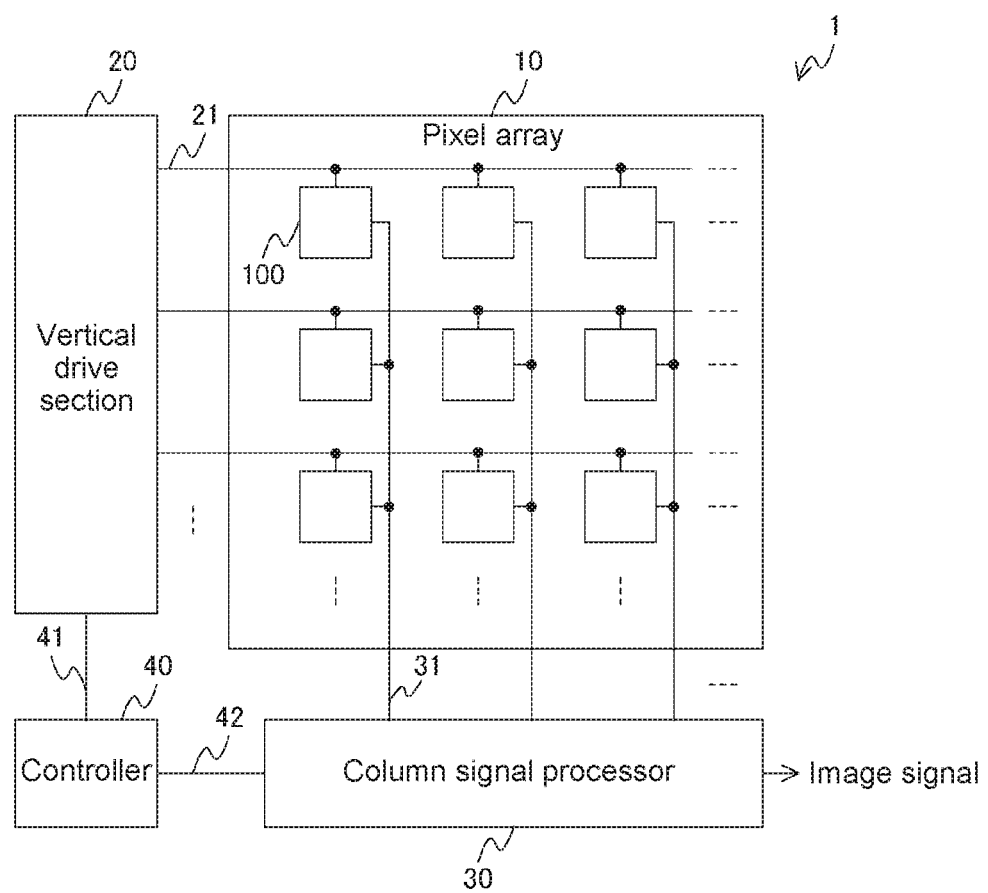
FIG. 1 illustrates a configuration example of an imaging device according to a first embodiment of the present technology.

FIG. 1 illustrates a configuration example of an imaging device according to a first embodiment of the present technology. An imaging device 1 in the figure includes a pixel array 10, a vertical drive section 20, a column signal processor 30, and a controller 40.

The pixel array 10 includes pixels 100 arranged in a two-dimensional grid. Here, the pixel 100 generates an image signal depending on irradiated light. The pixel 100 includes a photoelectric converter that generates a charge depending on irradiated light. The pixel 100 further includes a pixel circuit. The pixel circuit generates an image signal based on a charge generated by the photoelectric converter. The generation of an image signal is controlled by a control signal generated by the vertical drive section 20 described later. The pixel array 10 includes signal lines 21 and 31 arranged in an XY matrix. The signal line 21 is a signal line that transmits a control signal for the pixel circuit in the pixel 100. The signal line 21 is arranged for each row of the pixel array 10 and wired in common with respect to the pixels 100 arranged in each row. The signal line 31 is a signal line that transmits an image signal generated by the pixel circuit of the pixel 100. The signal line 31 is arranged for each column of the pixel array 10 and wired in common with respect to the pixels 100 arranged in each column. The photoelectric converter and the pixel circuit are formed in a semiconductor substrate.

The vertical drive section 20 generates a control signal for the pixel circuit of the pixel 100. The vertical drive section 20 transmits the generated control signal to the pixel 100 through the signal line 21 in the figure. The column signal processor 30 processes an image signal generated by the pixel 100. The column signal processor 30 processes the image signal transmitted from the pixel 100 through the signal line 31 in the figure. The processing performed by the column signal processor 30 corresponds to, for example, an analog-to-digital conversion that converts an analog image signal generated in the pixel 100 into a digital image signal. The image signal processed by the column signal processor 30 is output as an image signal of the imaging device 1. The controller 40 controls the entire imaging device 1. The controller 40 controls the imaging device 1 by generating and outputting a control signal used to control the vertical drive section 20 and the column signal processor 30. The control signal generated by the controller 40 is transmitted to the vertical drive section 20 and the column signal processor 30 respectively through signal lines 41 and 42.

[Configuration of Circuit of Pixel]

Figure 2:
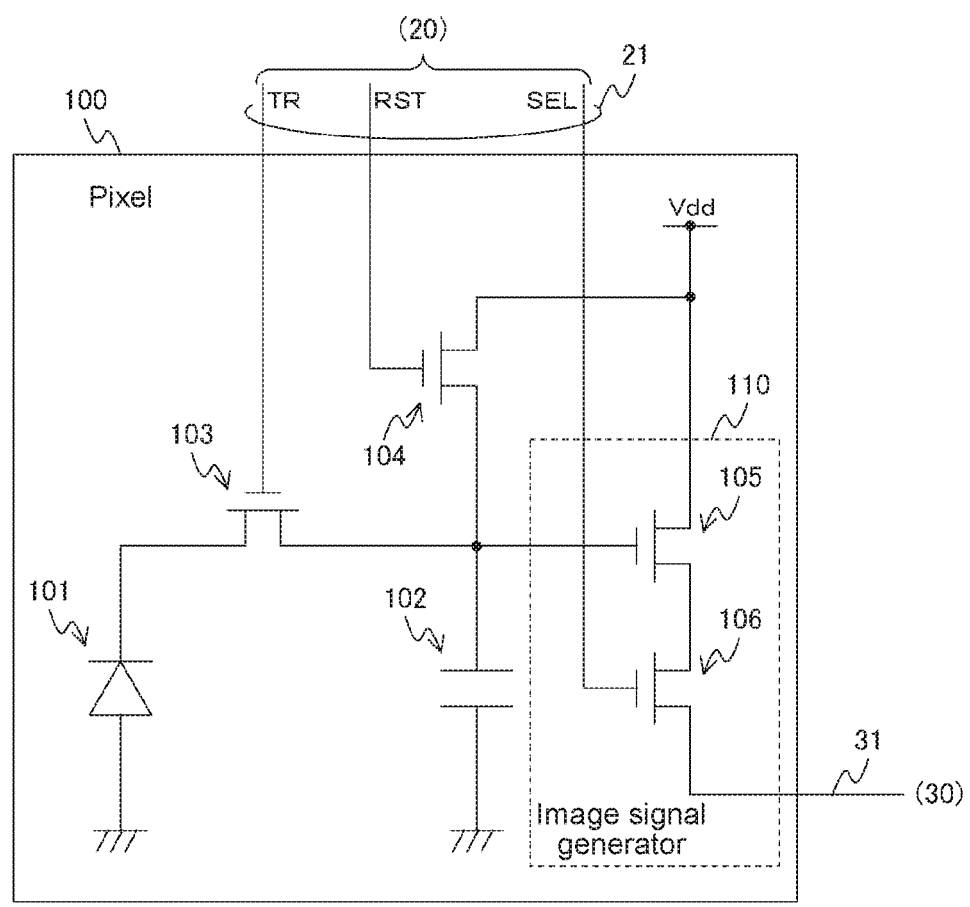
FIG. 2 illustrates a configuration example of a circuit of a pixel according to the first embodiment of the present technology.

FIG. 2 illustrates a configuration example of a circuit of a pixel according to the first embodiment of the present technology. The figure is a circuit diagram illustrating a configuration example of the pixel 100. The pixel 100 in the figure includes a photoelectric converter 101, a charge holding section 102, a charge transfer section 103, a reset section 104, and MOS transistors 105 and 106. Note that the MOS transistors 105 and 106 make up an image signal generator 110.

An anode of the photoelectric converter 101 is grounded, and a cathode of the photoelectric converter 101 is connected to a source of the charge transfer section 103. A drain of the charge transfer section 103 is connected to a source of the reset section 104, a gate of the MOS transistor 105, and one of the ends of the charge holding section 102. The other end of the charge holding section 102 is grounded. Drains of the reset section 104 and the MOS transistor 105 are connected to a power supply line Vdd in common, and a source of the MOS transistor 105 is connected to a drain of the MOS transistor 106. A source of the MOS transistor 106 is connected to the signal line 31. Gates of the charge transfer section 103, the reset section 104, and the MOS transistor 106 are respectively connected to a transfer signal line TR, a reset signal line RST, and a selection signal line SEL. Note that the transfer signal line TR, the reset signal line RST, and the selection signal line SEL make up the signal line 21.

As described above, the photoelectric converter 101 generates a charge depending on irradiated light. A photodiode may be used as the photoelectric converter 101.

The charge transfer section 103 is a MOS transistor that transfers, to the charge holding section 102, a charge generated by photoelectric conversion performed by the photoelectric converter 101. The transfer of a charge that is performed by the charge transfer section 103 is controlled by a signal transmitted thorough the transfer signal line TR. The charge holding section 102 is a capacitor that holds the charge transferred by the charge transfer section 103. The MOS transistor 105 is a transistor that generates a signal based on the charge held in the charge holding section 102. The MOS transistor 106 is a transistor that outputs the signal generated by the MOS transistor 105 to the signal line 31 as an image signal. The MOS transistor 106 is controlled by a signal transmitted through the select signal line SEL.

The reset section 104 is a transistor that resets the charge holding section 102 by draining the charge held in the charge holding section 102 to the power supply line Vdd. The reset performed by the reset section 104 is controlled by a signal transmitted through the reset signal line RST, and is performed before the transfer of a charge that is performed by the charge transfer section 103. Note that, when the reset is performed, it is also possible to reset the photoelectric converter 101 by bringing the charge transfer section 103 into conduction.

Generation of an image signal in the pixel 100 in the figure can be performed as indicated below. First, the reset section 104 and the charge transfer section 103 are brought into conduction to reset the photoelectric converter 101. Next, after a lapse of a specified exposure period, the reset section 104 is brought into conduction again to reset the charge holding section 102. Next, the charge transfer section 103 is brought into conduction. This results in a charge generated by the photoelectric converter 101 being transferred to the charge holding section 102 and being held in the charge holding section 102. This results in the MOS transistor 105 generating an image signal depending on the charge held in the charge holding section 102. Next, the MOS transistor 106 is brought into conduction, and the image signal generated by the MOS transistor 108 is output to the signal line 31. The processing that includes exposure performed by the photoelectric converter 101, generation of an image signal, and output of the image signal is performed for each row of pixels 100 arranged in the pixel array 10 at staggered times in a sequential manner, and this results in being able to perform imaging by the rolling shutter method.

[Configuration of Cross Section of Pixel]

Figure 3:
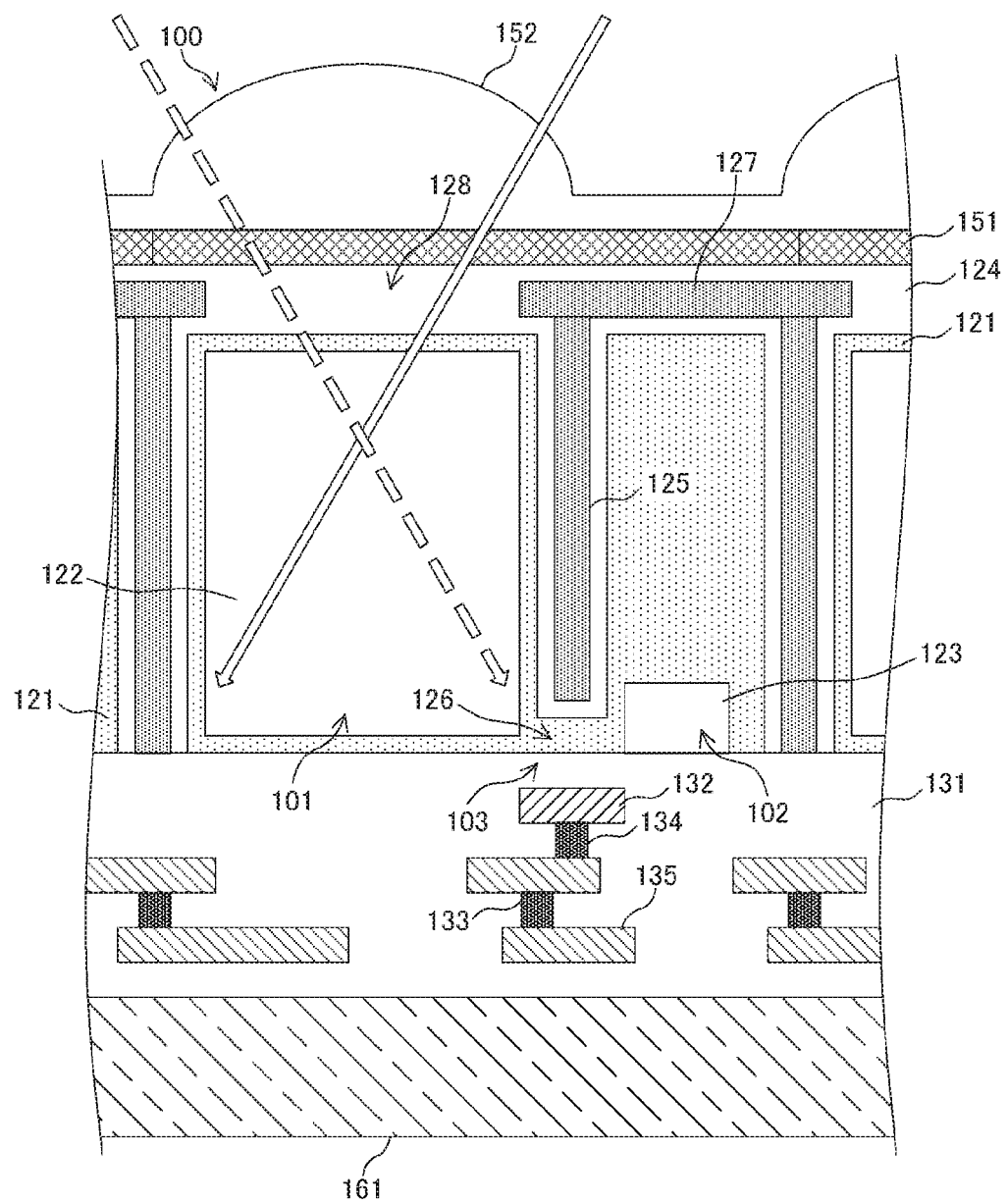
FIG. 3 is a cross-sectional view illustrating a configuration example of the pixel according to the first embodiment of the present technology.

FIG. 3 is a cross-sectional view illustrating a configuration example of the pixel according to the first embodiment of the present technology. The figure illustrates a configuration example of a cross section of the pixel 100. The pixel 100 in the figure includes a semiconductor substrate 121, an insulation layer 131, a wiring layer 135, an insulation film 124, a light-blocking wall 125, a light-blocking film 127, a color filter 151, an on-chip lens 152, and a support substrate 161.

The semiconductor substrate 121 is a semiconductor substrate in which the photoelectric converter and the MOS transistors of the pixel 100 that are described with reference to FIG. 2 are formed. Further, semiconductor portions of the vertical drive section 20, the column signal processor 30, and the controller 40 are formed in the semiconductor substrate 121. A p-type well region is formed in the semiconductor substrate 121, and the photoelectric converter and the like of the pixel 100 are formed in the well region. For convenience, it is assumed that the semiconductor substrate 121 makes up the well region. The figure illustrates the photoelectric converter 101, the charge holding section 102, and the charge transfer section 103.

The photoelectric converter 101 is formed of an n-type semiconductor region 122 and a p-type well region surrounding the n-type semiconductor region 122. A photodiode is formed of a p-n junction that is an interface between the n-type semiconductor region 122 and the p-type well region, and photoelectric conversion is performed. An electron from among a charge generated by the photoelectric conversion is held in the n-type semiconductor region 122. The held electron is transferred to the charge holding section 102 by the charge transfer section 103. Note that a pinning region used to perform pinning on a surface level of the semiconductor substrate 121 may also be formed on the surface of the n-type semiconductor region 122. The charge holding section 102 is formed of an n-type semiconductor region 123. The charge transfer section 103 is a MOS transistor in which the n-type semiconductor regions 122 and 123 are a source region and a drain region, respectively, and a p-type well region between the n-type semiconductor regions 122 and 123 is a channel region. Further, a gate 132 is arranged in the charge transfer section 103 through the insulation film. The gate 132 may be made of a polycrystalline silicon.

The insulation film 124 is a film that insulates the semiconductor substrate 121. The insulation film 124 is made of oxide such as $SiO_2$, and insulates the semiconductor substrate 121 from the color filter 151 described later. Further, the insulation film 124 in the figure is also arranged between the photoelectric converter 101 and the charge holding section 102 as a separation region. Here, the separation region is a region that prevents a charge from moving between the photoelectric converter 101 and the charge holding section 102. Note that the light-blocking wall 125 described later can be arranged in the separation region in the figure (the insulation film 124).

The wiring layer 135 is wiring used to transmit an image signal generated in the pixel 100 and a control signal used to control the pixel circuit. The signal lines 21 and 31 described with reference to FIG. 1 are made up of the wiring layer 135. The wiring layer 135 may be made of metal such as copper (Cu). The insulation layer 131 insulates the wiring layer 135. For example, the insulation layer 131 may be made of oxide such as $SiO_2$. Further, the wiring layer 135 may have a multi-layer structure. The figure illustrates an example of a wiring layer having a two-layer structure. The wiring layers 135 arranged in different layers may be connected to each other through a via plug 133. Further, an element formed in the semiconductor substrate 121 and the wiring layer 135 may be connected to each other using a contact plug 134. In the figure, the gate 132 of the charge transfer section 103 is connected to the wiring layer 135 using the contact plug 134. The wiring layer 135 and the insulation layer 131 form a wiring region.

The support substrate 161 is a substrate that supports the semiconductor substrate 121. The support substrate 161 is bonded to the wiring region, and improves the strength of the semiconductor substrate 121 upon manufacturing the imaging device 1. For example, a wafer made of Si may be used for the support substrate 161.

The on-chip lens 152 is a lens that collects light from a subject. The color filter 151 is an optical filter through which light of a specified wavelength from among the light collected by the on-chip lens 152 is transmitted. For example, the color filter 151 through which one of red light, green light, and blue light is transmitted may be used as the color filter 151.

The light-blocking wall 125 prevents incident light entering the pixel 100 from entering the charge holding section 102. The light-blocking wall 125 is arranged in a separation region (the insulation film 124), and prevents incident light transmitted through the photoelectric converter 101 from entering the charge holding section 102. For example, the light-blocking wall 125 may be made of metal such as tungsten (W), aluminum (Al), or copper (Cu). Further, a film that is made of, for example, titanium (Ti) or titanium nitride (TiN) and has a thickness of a few nanometers to tens of nanometers may also be arranged before a film made of the metal described above is formed. This is for improvement in adhesion. Note that an opening 126 is formed in the insulation film 124 and the light-blocking wall 125 that are situated between the photoelectric converter 101 and the charge holding section 102. A channel region of the charge transfer section 103 is arranged at the position of the opening 126, and a charge generated by the photoelectric converter 101 is transferred to the charge holding section 102. Note that the insulation film 124 and the light-blocking wall 125 may also be arranged between the charge holding section 102, and the photoelectric converter 101 of an adjacent pixel 100. An opening is not formed in the insulation film 124 and the light-blocking wall 125 that are arranged between the different pixels 100.

For example, the insulation film 124 and the light-blocking wall 125 may be formed as indicated below. First, a trench is formed from a back surface of the semiconductor substrate 121 using dry etching. There is a need to change the depth of the trench according to where to form the trench. In order to leave a region of the semiconductor substrate 121 that has a width that enables a charge to be transferred, a non-through trench that does not penetrate the semiconductor substrate 121 is formed at a position at which the opening 126 is formed. On the other hand, a through-trench of a depth that enables the through-trench to penetrate the semiconductor substrate 121 is formed in a portion in which the opening 126 is not formed. This is for enhancement in a light-blocking performance of the light-blocking wall 125.

A specific formation method is as indicated below. A film made of, for example, SiN is arranged on the back surface of the semiconductor substrate 121, and openings of both a through-trench and a non-through trench are formed to form a hard mask. Next, a resist is formed in the opening of the non-through trench of the hard mask using photolithography. Next, dry etching is performed to form a trench of a specified depth in the semiconductor substrate 121 of a region of the through-trench. Next, the resist is removed, and dry etching is performed again. In a portion of the through-trench, a trench is formed that has a depth extending up to near a front surface of the semiconductor substrate 121, and in a portion of the non-through trench, a trench is formed that has a depth that ensures the opening 126. Note that the depth of a trench can be adjusted by controlling the time to perform dry etching. Next, an insulator film and a metal film that respectively serve as material of the insulation film 124 and material of the light-blocking wall 125 are sequentially formed in the trench using atomic layer deposition (ALD) or chemical vapor deposition (CVD). This makes it possible to form the insulation film 124 and the light-blocking wall 125 in the separation region.

As in the case of the light-blocking wall 125, the light-blocking film 127 prevents incident light from entering the charge holding section 102. The light-blocking film 127 is arranged between the semiconductor substrate 121 and the color filter 151. An opening 128 is formed in the light-blocking film 127 near the photoelectric converter 101, and incident light is irradiated onto the photoelectric converter 101 through the opening 128. As in the case of the light-blocking wall 125, the light-blocking film 127 may also be made of metal such as W, Al, or Cu. Further, the light-blocking film 127 may also be formed at the same time as the light-blocking wall 125. The above-described metal film that is material of the light-blocking wall 125 is formed, and then, a resist having an opening is arranged in a region in which the opening 128 is formed. The light-blocking wall 125 and the light-blocking film 127 can be formed at the same time by performing dry etching using the resist as a mask. This makes it possible to reduce the number of manufacturing processes.

As described above, the light-blocking wall 125 and the light-blocking film 127 are arranged around the charge holding section 102, and irradiation of incident light onto the charge holding section 102 is reduced. When incident light is irradiated onto the charge holding section 102, photoelectric conversion is performed in the n-type semiconductor region 123 of the charge holding section 102, and a charge is generated. When the generated charge is superimposed on a charge generated by the photoelectric converter 101, an error occurs in an image signal generated by the pixel 100. Such a property of causing an error upon performing imaging is called parasitic light sensitivity (PLS), and is strictly controlled.

In the pixel 100 arranged in a central portion of the pixel array 10, light from a subject substantially perpendicularly enters the n-type semiconductor region 122 of the photoelectric converter 101. On the other hand, in the pixel 100 arranged in a surrounding portion of the pixel array 10, light from a subject enters obliquely. White arrows in the figure each represent obliquely incident light. Incident light is not directly irradiated onto the charge holding section 102 when the incident light obliquely enters the photoelectric converter 101 in a direction of a side different from a side on which the charge holding section 102 and the charge transfer section 103 are arranged, as indicated by the arrow in a solid line of the white arrows. This results in a reduction in influence on the PLS described above.

On the other hand, incident light is irradiated onto a position near the opening 126 when the incident light obliquely enters in the direction of the side on which the charge holding section 102 and the charge transfer section 103 are arranged, as indicated by the dotted arrow. There is an increase in leakage of incident light to the charge holding section 102, and this results in a reduction in PLS. Such a reduction in PLS significantly occurs in incident light of a long wavelength such as red light. The reason is that a relatively large amount of light reaches the position of the opening 126 since light of a long wavelength reaches a deep portion of the semiconductor substrate 121. A relationship between obliquely incident light, and the arrangement of the photoelectric converter 101, the charge holding section 102, and the charge transfer section 103 will be described later in detail.

[Configuration of Pixel]

Figure 4:
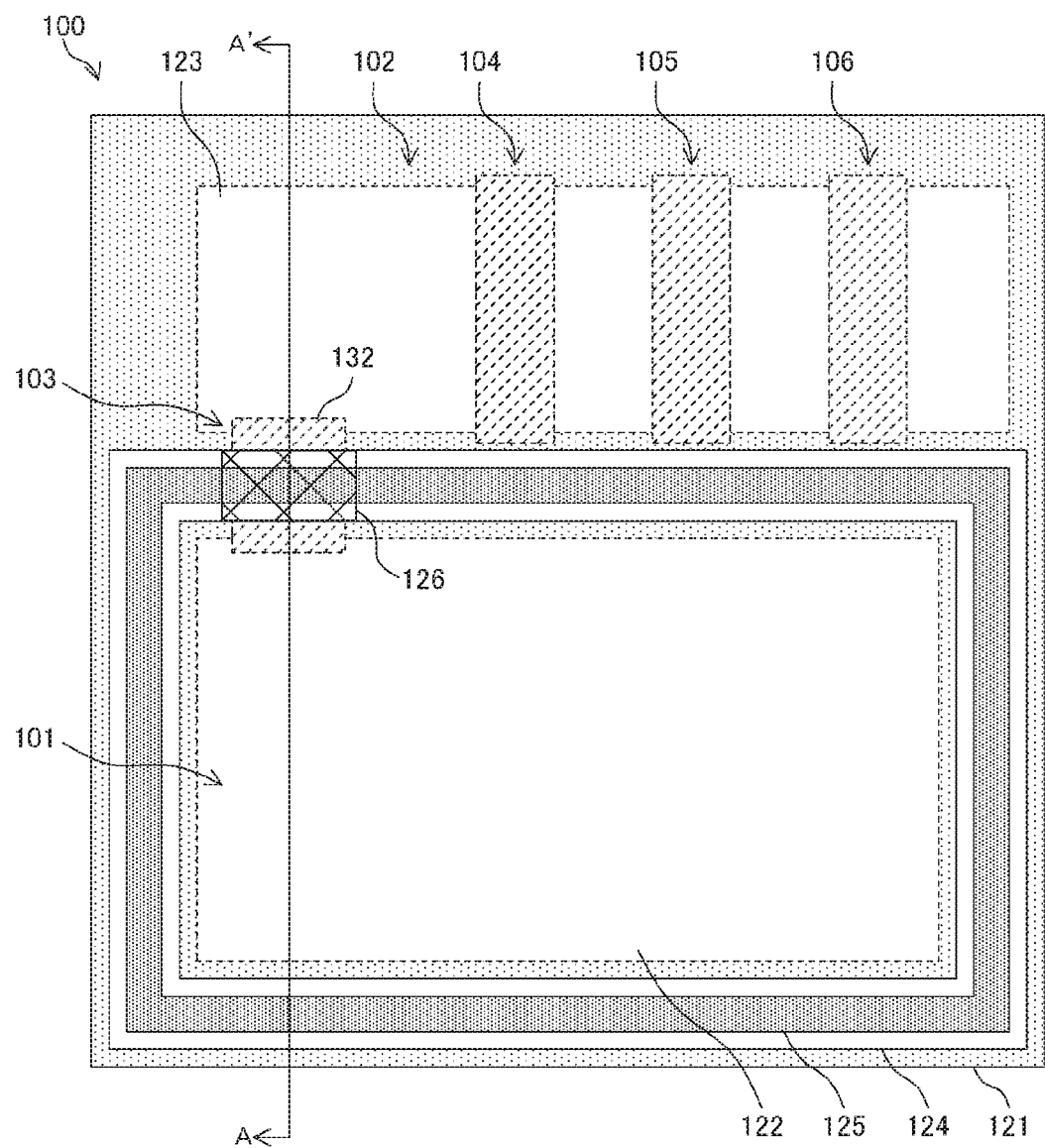
FIG. 4 illustrates a configuration example of the pixel according to the first embodiment of the present technology.

FIG. 4 illustrates a configuration example of the pixel according to the first embodiment of the present technology. The figure is a top view illustrating an arrangement example of the photoelectric converter 101 and the like of the pixel 100. FIG. 3 corresponds to a cross-sectional view taken along the line A-A' of FIG. 4. In the figure, a rectangular region in a dotted line represents an n-type semiconductor region formed in the semiconductor substrate 121, and a region hatched with a dotted line represents a gate of the MOS transistor. A region in the form of a net represents the opening 126 formed in the insulation film 124 and the light-blocking wall 125. Note that a description of the light-blocking film 127 is omitted.

The n-type semiconductor region 122 of the photoelectric converter 101 is arranged in a lower portion of the pixel 100 in the figure. The insulation film 124 and the light-blocking wall 125 are arranged to surround the n-type semiconductor region 122. The n-type semiconductor region 123 of the charge holding section 102 is arranged in an upper left portion of the pixel 100. The gate 132 of the charge transfer section 103 is arranged between the n-type semiconductor regions 122 and 123. Further, the gate 132 is arranged at the position of the opening 126. The gate and the drain region of the reset section 104 are arranged adjacent to the charge holding section 102. Note that the charge holding section 102 also corresponds to a source region of the MOS transistor. The gate and the source region of the MOS transistor 105 are arranged adjacent to the drain region of the reset section 104. Note that the drain region of the reset section 104 also corresponds to the drain region of the MOS transistor 105. A gate and the source region of the MOS transistor 106 are arranged adjacent to the source region of the MOS transistor 105. Note that the source region of the MOS transistor 105 also corresponds to the drain region of the MOS transistor 106.

The pixel 100 in the figure is an example in which the charge holding section 102 is arranged in an upper left corner of the figure. In the imaging device 1, the charge holding section 102 is arranged close to an optical center of the pixel array 10. This will be described later. In the figure, it is assumed that the position of the optical center is any position in an upper left direction in the pixel 100 of the figure.

[Configuration of Pixel Region]

Figure 5:
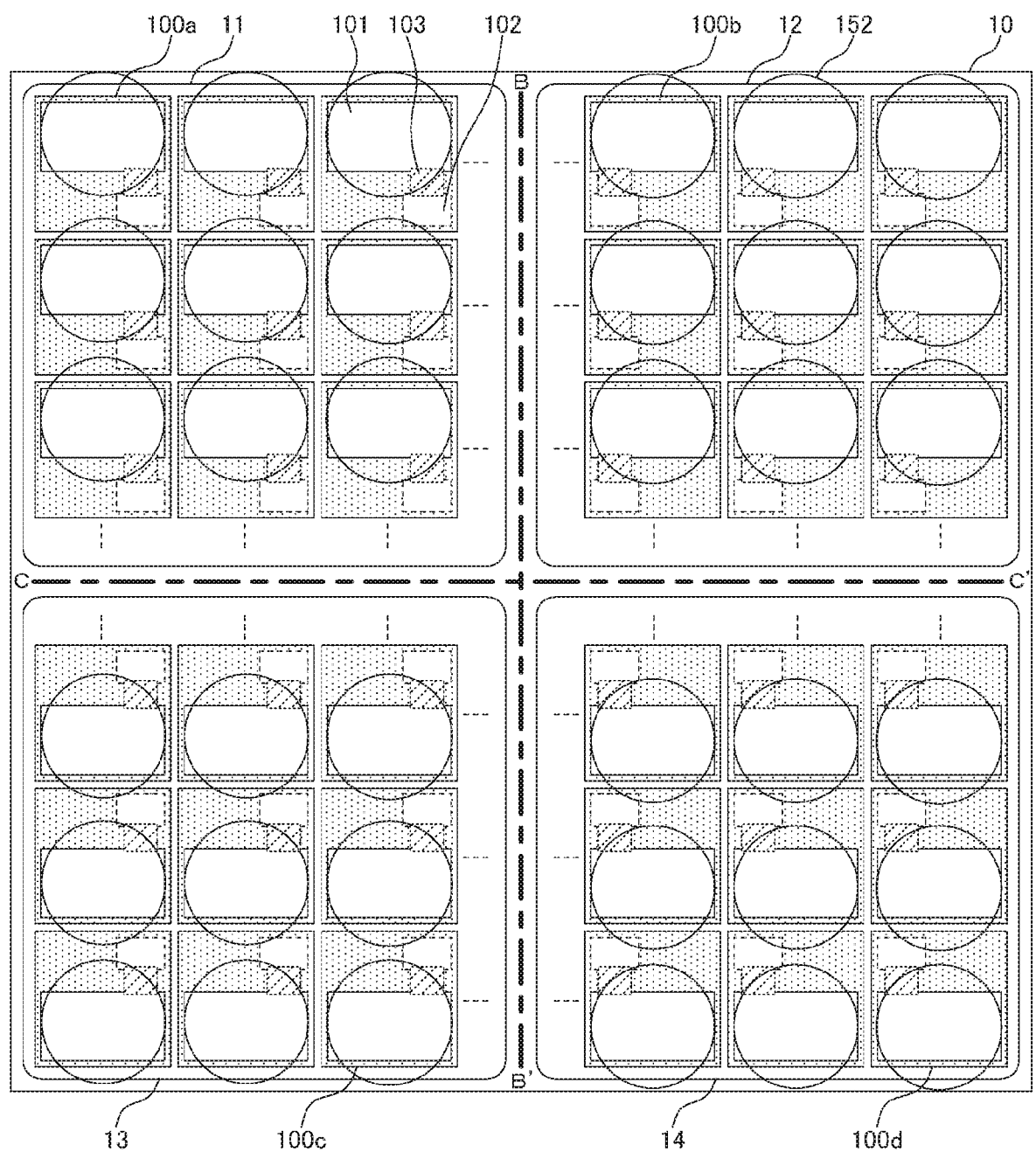
FIG. 5 illustrates a configuration example of a pixel region according to the first embodiment of the present technology.

FIG. 5 illustrates a configuration example of a pixel region according to the first embodiment of the present technology. The figure illustrates an arrangement example of the pixels 100 in the pixel array 10 of the imaging device 1.

The pixel 100 including the photoelectric converter 101, the charge holding section 102, and the charge transfer section 103 is illustrated in the figure. The photoelectric converter 101, the charge holding section 102, and the charge transfer section 103 are arranged as described with reference to FIG. 4. Further, a circle in the figure represents the on-chip lens 152.

The pixel array 10 includes a plurality of pixel regions. Here, the pixel region is a region including a plurality of pixels 100. Specifically, the pixel array 10 in the figure includes four pixel regions that are pixel regions 11 to 14. Each pixel region includes the pixels 100 having the same configuration. On the other hand, with respect to the pixels 100 arranged in different pixel regions, at least one of the photoelectric converter 101, the charge holding section 102, or the charge transfer section 103 in the pixel 100 of one of the different pixel regions is arranged symmetrically to the at least one of the photoelectric converter 101, the charge holding section 102, or the charge transfer section 103 in the pixel 100 of another of the different pixel regions. Note that a heavy dot-dash line in the figure indicates a boundary of pixel regions. The B-B' line passes through an optical center, and represents a boundary separating the pixel array 10 into a left pixel region and a right pixel region. The C-C' line passes through the optical center, and represents a boundary separating the pixel array 10 into an upper pixel region and a lower pixel region. Here, the optical center is the center of a region, in the imaging device 1 (the pixel array 10), onto which light from a subject is irradiated. In an image-capturing apparatus such as a camera, an image of light from a subject is formed on a surface of the imaging device 1 (the pixel array 10) on which the pixels 100 are arranged, the formation being performed by an imaging lens arranged outside of the imaging device 1. A camera lens including the imaging lens is arranged such that an optical axis of the camera lens passes through the optical center of the pixel array 10.

With respect to the adjacent pixel regions 11 and 12, the charge holding section 102 and the charge transfer section 103 in the pixel region 11 are respectively arranged symmetrically to the charge holding section 102 and the charge transfer section 103 in the pixel region 12. Likewise, with respect to the adjacent pixel regions 13 and 14, the charge holding section 102 and the charge transfer section 103 in the pixel region 13 are respectively arranged symmetrically to the charge holding section 102 and the charge transfer section 103 in the pixel region 14. With respect to the adjacent pixel regions 11 and 13, the photoelectric converter 101, the charge holding section 102, and the charge transfer section 103 in the pixel region 11 are respectively arranged symmetrically to the photoelectric converter 101, the charge holding section 102, and the charge transfer section 103 in the pixel region 13. Likewise, the adjacent pixel regions 12 and 14, the photoelectric converter 101, the charge holding section 102, and the charge transfer section 103 in the pixel region 12 are respectively arranged symmetrically to the photoelectric converter 101, the charge holding section 102, and the charge transfer section 103 in the pixel region 14.

Further, in the pixel 100 in the figure, the charge holding section 102 and the charge transfer section 103 are arranged close to the optical center, and the photoelectric converter 101 is arranged closer to the surrounding portion of the pixel array 10. Further, the photoelectric converters 101, the charge holding sections 102, and the charge transfer sections 103 are arranged such that one pixel region is the reflection of another pixel region across the B-B' line or the C-C' line. This results in a symmetrical arrangement being provided for each set of two adjacent pixel regions, as described above.

As described above, an image of incident light is formed by the imaging lens. Thus, light from a subject substantially perpendicularly enters the pixel 100 situated near the optical center. On the other hand, light from a subject obliquely enters the pixel 100 arranged away from the optical center. For example, with respect to one of the pixels 100 that is included in the pixel region 11 in the figure and arranged in an upper left corner, light enters the pixel 100 in a direction extending from the optical center to the upper left. However, it is possible to suppress entrance of obliquely irradiated incident light into the charge holding section 102 since the charge holding section 102 and the charge transfer section 103 are situated near the optical center. In other words, it is possible to avoid incident light obliquely entering in the direction indicated by the white dotted arrow described with reference to FIG. 3. The opening 126 of the insulation film 124 and the light-blocking wall 125 is formed at a position at which the charge transfer section 103 situated between the photoelectric converter 101 and the charge holding section 102 is arranged. Light obliquely entering the pixel 100 is irradiated onto the photoelectric converter 101 while avoiding the opening 126, and this results in suppressing entrance of light into the charge holding section 102.

Note that the arrangement of a pixel region is not limited to this example. For example, pixel regions may be arranged adjacent to each other along a diagonal line passing through the optical center.

[Modification]

In the imaging device 1 described above, the charge holding section 102 is arranged close to the optical center. However, the charge transfer section 103 may be arranged close to the optical center.

Figure 6:
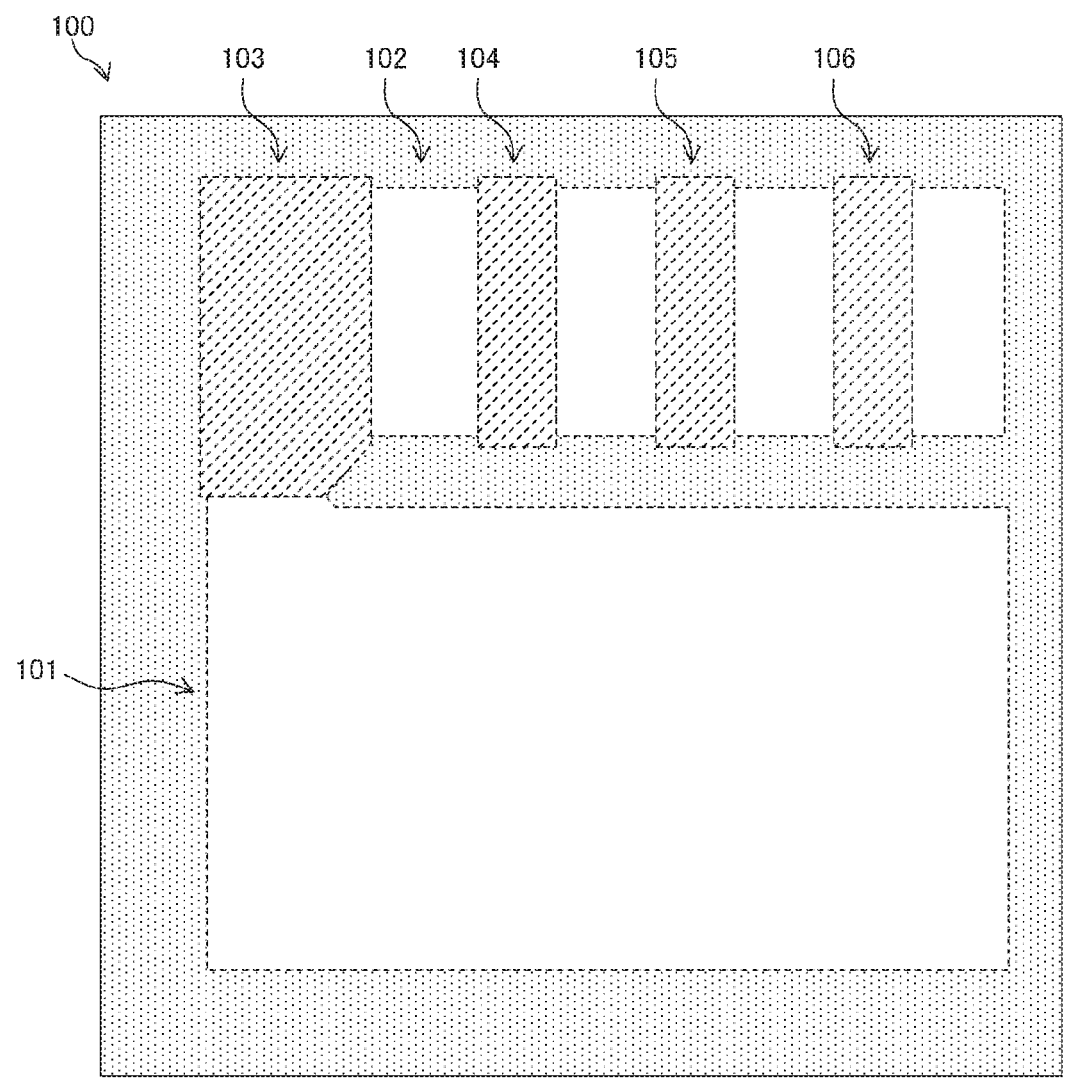
FIG. 6 illustrates a configuration example of a pixel according to a modification of the first embodiment of the present technology.

FIG. 6 illustrates a configuration example of a pixel according to a modification of the first embodiment of the present technology. As in the case of FIG. 4, the figure is a top view illustrating an arrangement example of the photoelectric converter 101 and the like of the pixel 100. Note that descriptions of the insulation film 124 and the light-blocking wall 125 are omitted in the figure. The charge transfer section 103 is arranged in an upper left corner of the pixel 100 in the figure. In other words, the charge transfer section 103 is arranged close to the optical center of the pixel array 10.

As described above, in the imaging device 1 of the first embodiment of the present disclosure, the charge holding section 102 or the charge transfer section 103 is arranged close to the optical center of the pixel array 10 in the pixel 100. This makes it possible to suppress entrance of light into the charge holding section 102, and thus to prevent a reduction in image quality.

2. Second Embodiment

With respect to the imaging device 1 of the first embodiment described above, the pixel array 10 including a plurality of pixel regions has been described. On the other hand, an arrangement of the pixel 100 at a boundary of pixel regions is proposed in a second embodiment of the present disclosure.

[Boundary of Pixel Regions]

Figure 7:
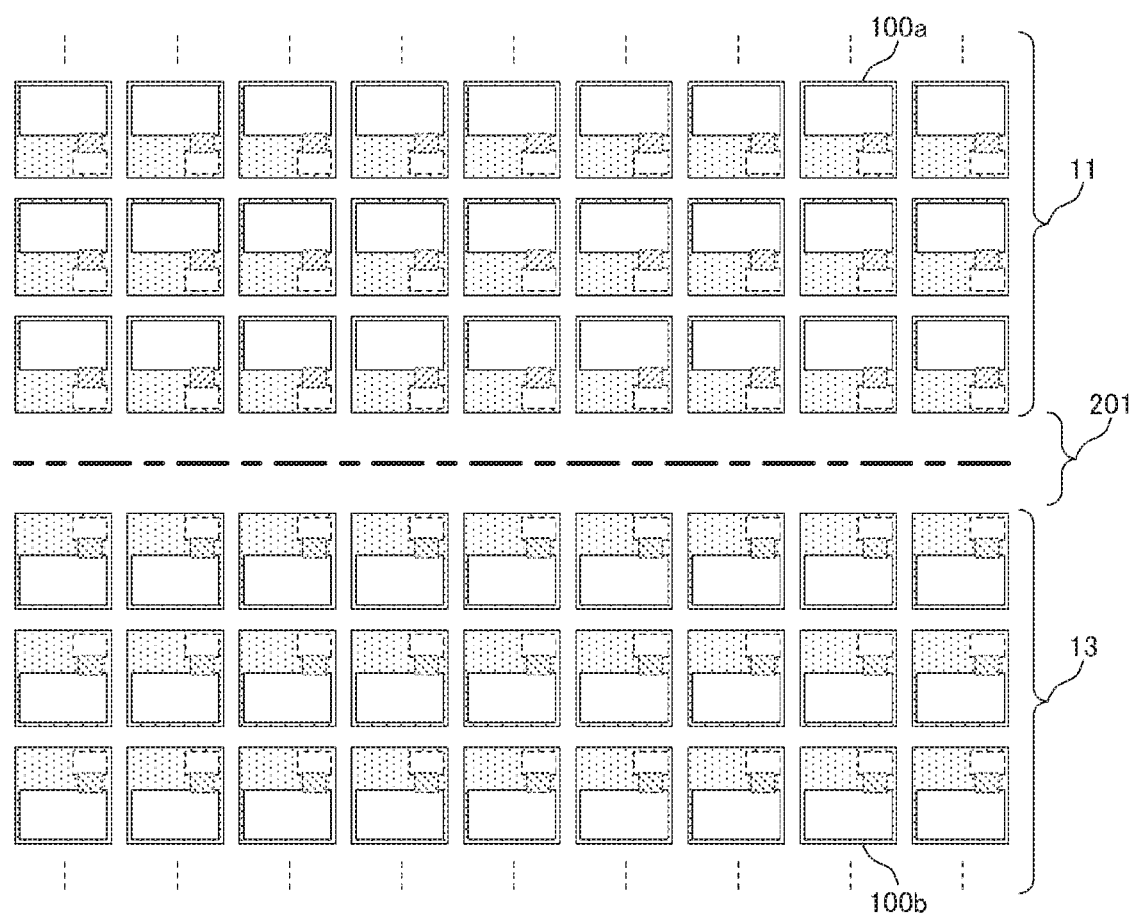
FIG. 7 illustrates an example of a boundary of pixel regions according to an embodiment of the present technology.

FIG. 7 illustrates an example of a boundary of pixel regions according to an embodiment of the present technology. The figure is a diagram of a comparative example, and illustrates an arrangement of the pixels 100 at a boundary of the pixel regions 11 and 13 in the pixel array 10 described with reference to FIG. 5. As in the case of FIG. 5, a heavy dot-dash line indicates a boundary of pixel regions. As described above, the photoelectric converter 101 in the pixel 100 of the pixel region 11 is arranged on an upper portion in the figure, and the photoelectric converter 101 in the pixel 100 of the pixel region 13 is arranged in a lower portion in the figure. Thus, the pixels 100 adjacent to each other in a region 201 situated at a boundary of pixel regions are not allowed to be arranged with the same pitch as the other pixels 100, and this results in a loss for a single pixel. This results in a linear defect in an image situated in the region 201, and thus in a reduction in image quality.

Figure 8:
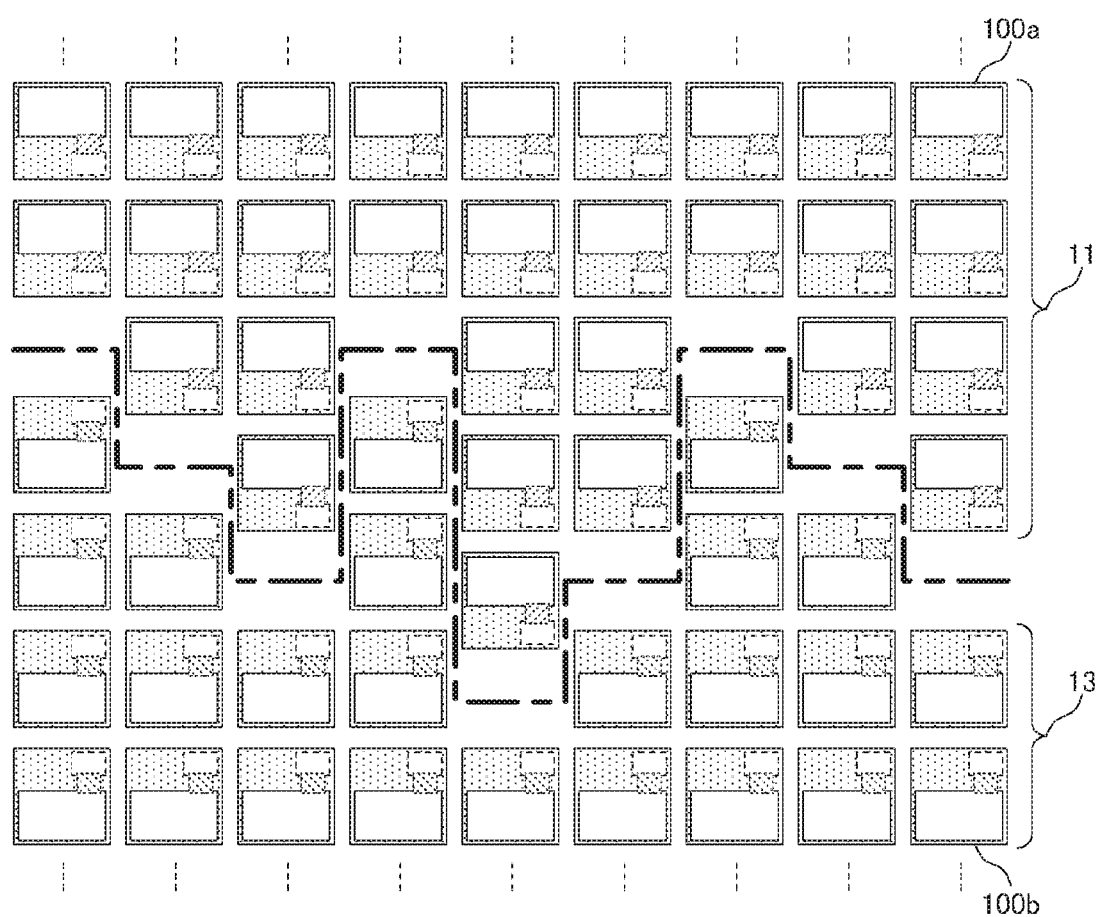
FIG. 8 illustrates an example of a boundary of pixel regions according to a second embodiment of the present technology.

FIG. 8 illustrates an example of a boundary of pixel regions according to the second embodiment of the present technology. The boundary of the pixel regions 11 and 13 in the figure has a shape different from a linear shape. Specifically, the boundary of the pixel regions 11 and 13 has an irregular shape having convex and concave portions, the convex or concave portion being provided for each pixel 100. The linear defect illustrated in FIG. 7 becomes unnoticeable due to the boundary of the pixel regions 11 and 13 being randomly changed, as illustrated in the figure, and this results in suppressing a reduction in image quality. Note that the shape of a boundary of pixel regions is not limited to this example. For example, the boundary may have a shape having convex and concave portions and being formed on the basis of a specified regulation. A method of repeatedly arranging, in a specified cycle, the irregular shape having convex and concave portions illustrated in FIG. 8 may be applied as the specified regulation.

[Other Examples of Boundary of Pixel Regions]

Figure 9:
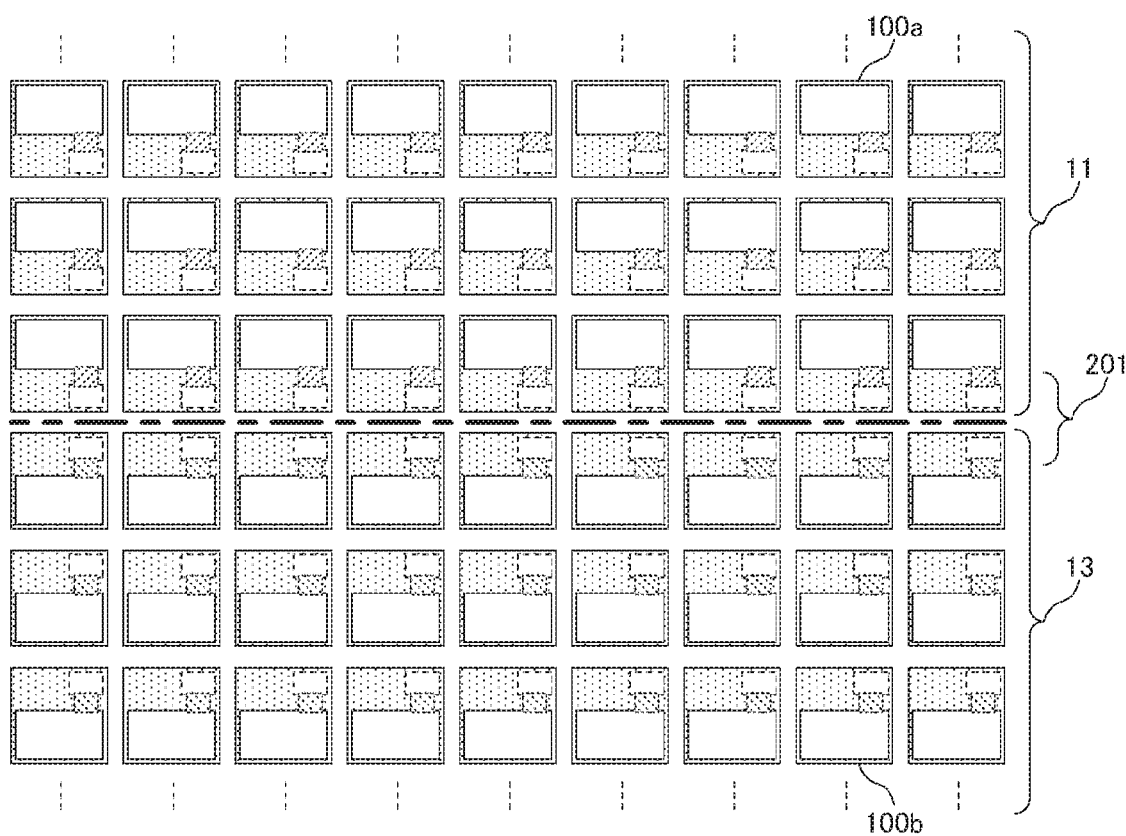
FIG. 9 illustrates another example of the boundary of pixel regions according to the second embodiment of the present technology.
Figure 10:
FIG. 10 illustrates another example of the boundary of pixel regions according to the second embodiment of the present technology.

FIGS. 9 and 10 illustrate other examples of the boundary of pixel regions according to the second embodiment of the present technology. FIG. 9 illustrates an example in which, in the pixel array 10 described with reference to FIG. 7, the pixels 100 have been arranged in the region situated at the boundary of pixel regions. FIG. 10 illustrates an example in which, in the pixel array 10 described with reference to FIG. 8, the pixels 100 have been similarly arranged therein. It is possible to adopt the arrangement of the pixels 100 as illustrated in FIG. 9 or 10 when a defect is not noticeable despite the fact that the pixels 100 are arranged with a discontinuous pitch in a region situated at a boundary of pixel regions, due to, for example, a high resolution of the pixel 100.

Except for the points described above, the imaging device 1 has a configuration similar to the configuration of the imaging device 1 described in the first embodiment of the present disclosure. Thus, the description is omitted.

As described above, in the imaging device 1 of the second embodiment of the present disclosure, it is possible to suppress a reduction in image quality by forming a boundary of pixel regions into a shape different from a linear shape.

3. Third Embodiment

In the imaging device 1 of the first embodiment described above, imaging is performed by the rolling shutter method. On the other hand, the imaging device 1 of a third embodiment of the present disclosure is different from the first embodiment described above in that imaging is performed by the global shutter method.

[Configuration of Circuit of Pixel]

Figure 11:
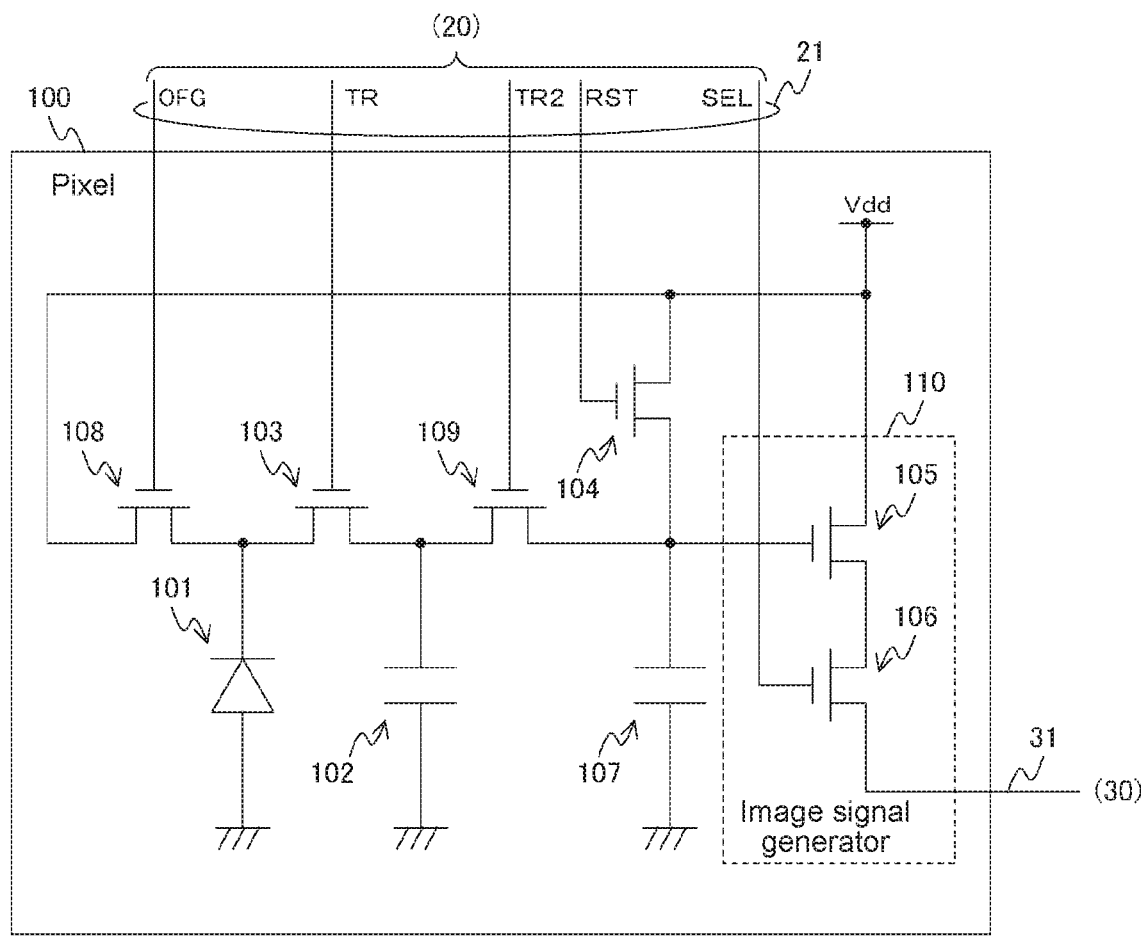
FIG. 11 illustrates a configuration example of a circuit of a pixel according to a third embodiment of the present technology.

FIG. 11 illustrates a configuration example of a circuit of a pixel according to the third embodiment of the present technology. The pixel 100 in the figure is different from the pixel 100 described with reference to FIG. 2 in further including a second charge holding section 107, an overflow gate 108, and a second charge transfer section 109. The signal line 21 in the figure further includes an overflow-gate signal line OFG and a second transfer signal line TR2.

A source of the overflow gate 108 is connected to the cathode of the photoelectric converter 101 and the source of the charge transfer section 103. A drain of the overflow gate 108 is connected to the power supply line Vdd, and a gate of the overflow gate 108 is connected to the overflow-gate signal line OFG. A source of the second charge transfer section 109 is connected to the drain of the first charge transfer section 103 and one of the ends of the charge holding section 102, and a gate of the second charge transfer section 109 is connected to the second transfer signal line TR2. A drain of the second charge transfer section 109 is connected to the source of the reset section 104, the gate of the MOS transistor 105, and one of the ends of the second charge holding section 107. The other end of the second charge holding section 107 is grounded. Except for the points described above, the pixel circuit has a connection similar to the connection of the pixel circuit of FIG. 2. Thus, the description is omitted.

The overflow gate 108 is a MOS transistor that resets the photoelectric converter 101. The overflow gate 108 is also capable of further draining a charge excessively generated by the photoelectric converter 101. The second charge holding section 107 is a capacitor that holds a charge that is generated by the photoelectric converter 101 and held in the charge holding section 102. The MOS transistor 105 generates an image signal depending on the charge held in the second charge holding section 107. The second charge transfer section 109 is a MOS transistor that transfers the charge held in the charge holding section 102 to the second charge holding section 107.

Generation of an image signal in the pixel 100 in the figure can be performed as indicated below. First, the overflow gate 108 is brought into conduction to reset the photoelectric converter 101. Next, after a lapse of a specified exposure period, the second charge transfer section 109 and the reset section 104 are brought into conduction to reset the charge holding section 102. Next, the charge transfer section 103 is brought into conduction. This results in a charge generated by the photoelectric converter 101 being transferred to the charge holding section 102 and being held in the charge holding section 102. The operation from the reset of the photoelectric converter 101 to the transfer of a charge that is performed by the charge transfer section 103 is performed in all of the pixels 100 arranged in the pixel array 10 at the same time. In other words, a global reset that is a reset performed in all of the pixels 100 at the same time, and transfer of a charge that is performed in all of the pixels 100 at the same time are performed. Consequently, global shutter is performed.

Next, the reset section 104 is brought into conduction again to reset the second charge holding section 107. Next, the second charge transfer section 109 is brought into conduction, and the charge held in the charge holding section 102 is transferred to the second charge holding section 107 and held in the second charge holding section 107. This results in the MOS transistor 105 generating an image signal depending on the charge held in the second charge holding section 107. Next, the MOS transistor 106 is brought into conduction, and the image signal generated by the MOS transistor 105 is output to the signal line 31. The operation from the reset of the second charge holding section 107 to the output of an image signal is performed for each set of pixels 100 arranged in a row of the pixel array 10 in a sequential manner.

By performing the generation and the output of an image signal in the pixel 100 in parallel with each other during the exposure period described above, it is possible to reduce the time necessary to perform imaging and to transfer an image signal. Further, by performing exposure in all of the pixels 100 of the pixel array 10 at the same time, it is possible to prevent the occurrence of a focal plane distortion and thus to improve image quality. As described above, the charge holding section 102 of the pixel 100 in the figure is used to temporarily hold a charge generated by the photoelectric converter 101 when global shutter is performed.

[Configuration of Pixel]

Figure 12:
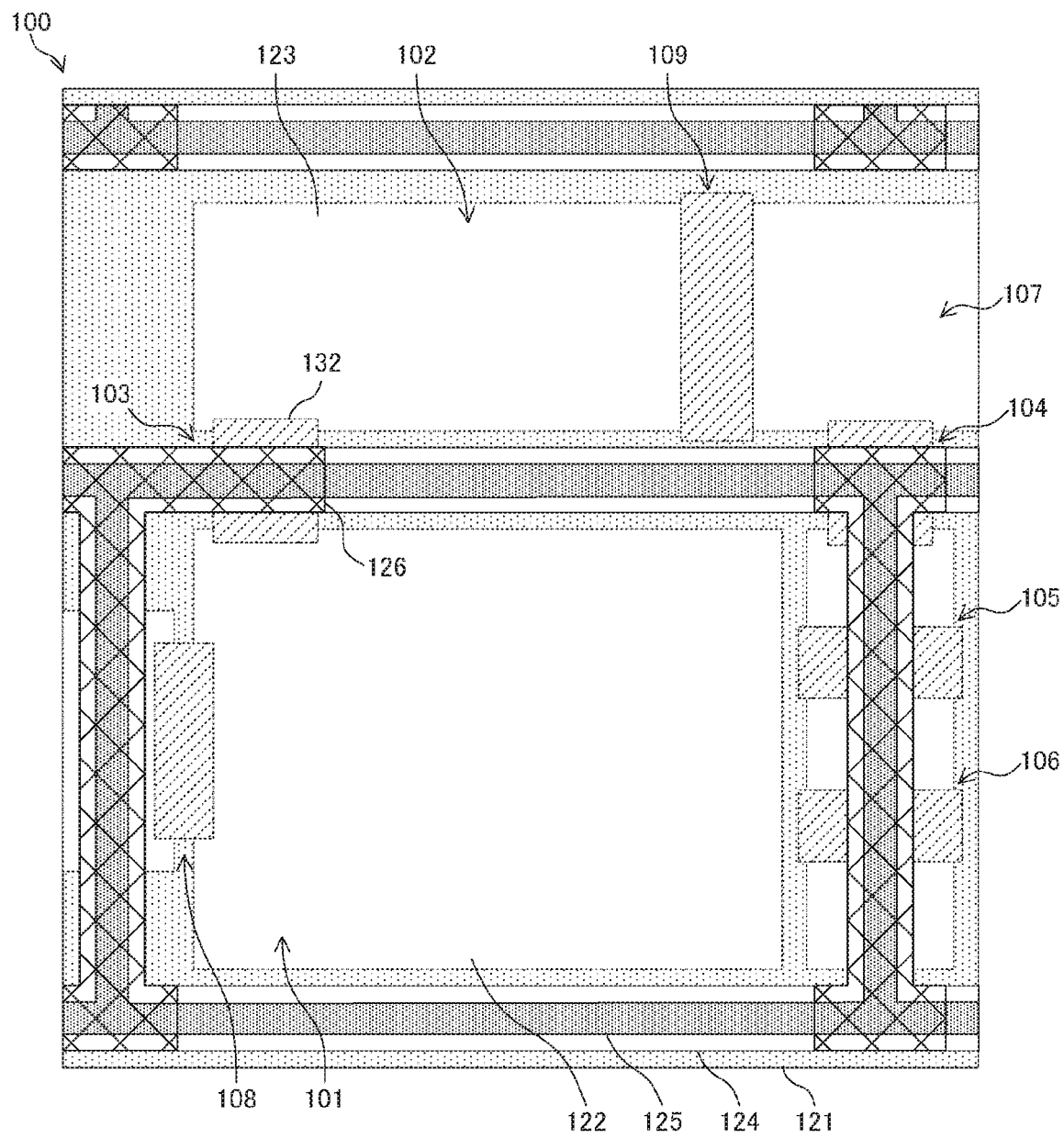
FIG. 12 illustrates a configuration example of the pixel according to the third embodiment of the present technology.

FIG. 12 illustrates a configuration example of the pixel according to the third embodiment of the present technology. As in the case of FIG. 3, the figure is a top view illustrating an arrangement example of the photoelectric converter 101 and the like of the pixel 100. The photoelectric converter 101 is arranged in a lower portion of the pixel 100 in the figure. The gate and the drain region of the overflow gate 108 are arranged adjacent to the photoelectric converter 101 on the left of the photoelectric converter 101. Further, the drain region of the overflow gate 108 is shared with the pixel 100 adjacent on the left. The charge transfer section 103 and the charge holding section 102 are arranged on the left above the photoelectric converter 101, and the second charge transfer section 109 is arranged adjacent to the charge holding section 102. The second charge holding section 107 is arranged adjacent to the second charge transfer section 109. The reset section 104 and the MOS transistors 105 and 106 are arranged under the second charge holding section 107 in order from the second charge holding section 107, the reset section 104 being adjacent to the second charge holding section 107. Note that the second charge holding section 107, the reset section 104, and the MOS transistors 105 and 106 are shared with the pixel 100 adjacent on the right.

The insulation film 124 and the light-blocking wall 125 are respectively continuously connected to the insulation film 124 and the light-blocking wall 125 in the adjacent pixel 100. Further, as in the case of FIG. 4, a region in the form of a net represents an opening of the insulation film 124 and the light-blocking wall 125. The opening is formed near the charge transfer section 103, the drain region of the overflow gate 108, the reset section 104, and the MOS transistors 105 and 106. Further, in the pixel 100 in the figure, the charge holding section 102 is arranged in an upper portion of the figure.

Note that the configuration of the pixel 100 is not limited to this example. For example, the charge holding section 102 in the figure may include a plurality of gate electrodes, and switching of an applied voltage may be performed with respect to the plurality of gate electrodes. By performing switching of an applied voltage with respect to the plurality of gate electrodes in a sequential manner, it is possible to partially change a potential of the n-type semiconductor region 123 of the charge holding section 102, and to perform a transfer of a charge that is similar to the transfer performed using a charge coupled device (CCD). This makes it possible to transfer all of the charges generated by the photoelectric converter 101 to the second charge holding section 107.

[Configuration of Pixel Region]

Figure 13:
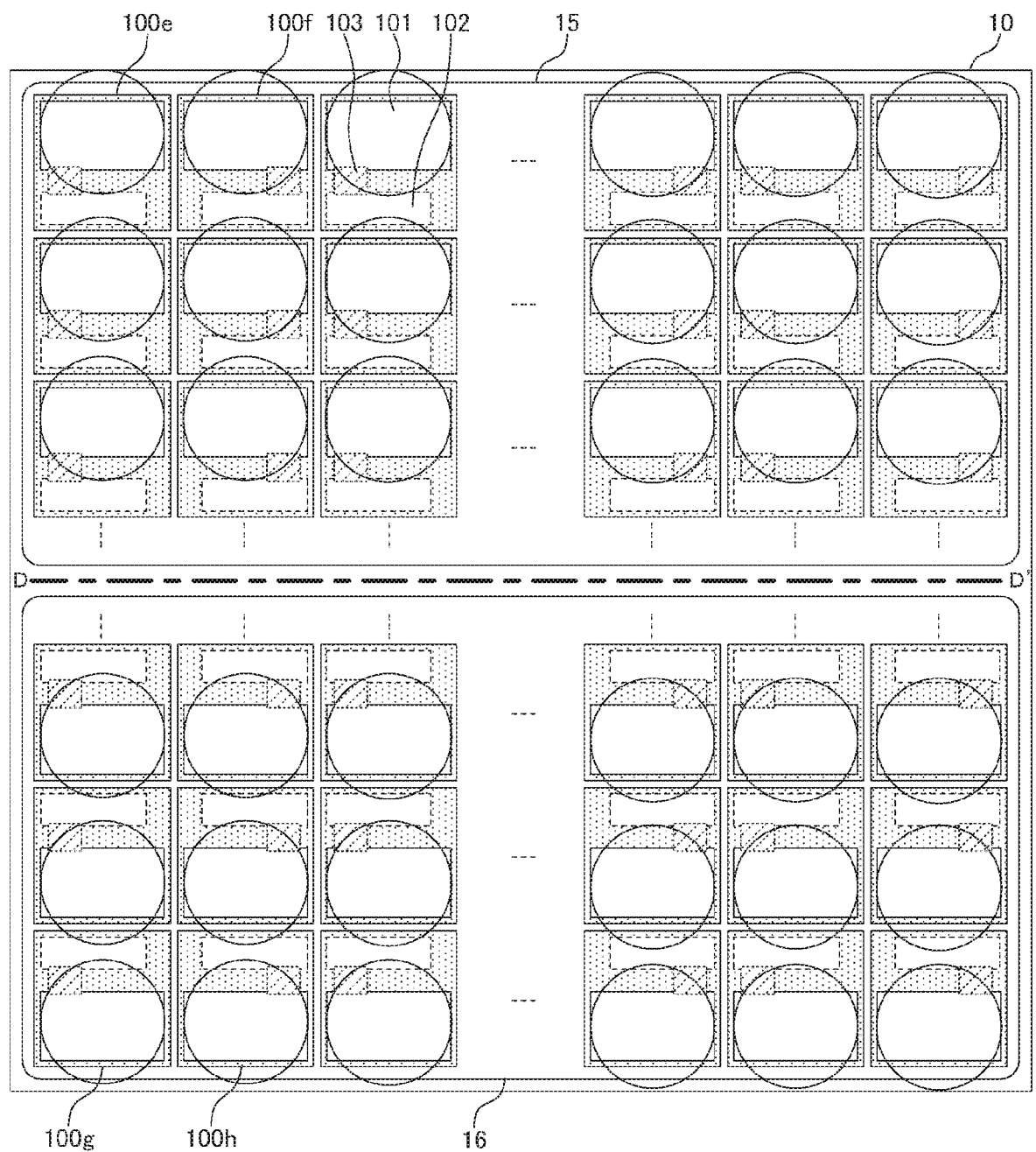
FIG. 13 illustrates a configuration example of a pixel region according to the third embodiment of the present technology.

FIG. 13 illustrates a configuration example of a pixel region according to the third embodiment of the present technology. As in the case of FIG. 5, the figure illustrates an arrangement example of the pixels 100 in the pixel array 10 of the imaging device 1. As in the case of FIG. 5, the pixel 100 including the photoelectric converter 101, the charge holding section 102, and the charge transfer section 103 is illustrated in the figure. The pixel array 10 in the figure includes pixel regions 15 and 16. The D-D' line passes through the optical center, and represents a boundary separating the pixel array 10 into an upper pixel region and a lower pixel region. The photoelectric converter 101, the charge holding section 102, and the charge transfer section 103 in the pixel 100 of the pixel region 15 are respectively arranged symmetrically to the photoelectric converter 101, the charge holding section 102, and the charge transfer section 103 in the pixel 100 of the pixel region 16.

As described with reference to FIG. 12, the overflow gate 108 and the second charge holding section 107 are shared with an adjacent pixel 100. Thus, with respect to two pixels 100 adjacent to each other in a lateral direction in the figure, the photoelectric converter 101, the charge holding section 102, and the charge transfer section 103 in one of the two adjacent pixels 100 are respectively arranged symmetrically to the photoelectric converter 101, the charge holding section 102, and the charge transfer section 103 in another of the two adjacent pixels 100. Specifically, the photoelectric converter 101, the charge holding section 102, and the charge transfer section 103 in a pixel 100*e* of the pixel region 15 are respectively arranged bilaterally symmetrically to the photoelectric converter 101, the charge holding section 102, and the charge transfer section 103 in a pixel 100*f* of the pixel region 15. Likewise, the photoelectric converter 101, the charge holding section 102, and the charge transfer section 103 in a pixel 100*g* of the pixel region 16 are respectively arranged bilaterally symmetrically to the photoelectric converter 101, the charge holding section 102, and the charge transfer section 103 in a pixel 100*h* of the pixel region 16. These pixels 100 are arranged such that one pixel region is the reflection of another pixel region across the D-D' line. The charge holding section 102 and the charge transfer section 103 are arranged close to the optical center, and the photoelectric converter 101 is arranged closer to an upper or lower surrounding portion of the pixel array 10. This makes it possible to suppress entrance of light into the charge holding section 102.

Compared to the case of the pixel 100 described with reference to FIG. 1, a charge is held in the charge holding section 102 for a longer time in the case of the pixel 100 in the figure since imaging is performed by the global shutter method. Even this case, it is possible to prevent a reduction in image quality by arranging the charge holding section 102 and the charge transfer section 103 close to the optical center to suppress entrance of incident light into the charge holding section 102.

Except for the points described above, the imaging device 1 has a configuration similar to the configuration of the imaging device 1 described in the first embodiment of the present disclosure. Thus, the description is omitted.

As described above, in the imaging device 1 of the third embodiment of the present disclosure, the charge holding section 102 or the charge transfer section 103 is arranged close to the optical center of the pixel array 10 in the pixel 100. This makes it possible to suppress entrance of light into the charge holding section 102 when imaging is performed by the global shutter method with respect to the pixel 100, and thus to prevent a reduction in image quality.

4. Fourth Embodiment

In the imaging device 1 of the first embodiment described above, the on-chip lens 152 is arranged at the same position in all of the pixels 100. On the other hand, the imaging device 1 of a fourth embodiment of the present disclosure is different from the first embodiment in that the position of the on-chip lens 152 is adjusted according to the distance from the optical center.

[Configuration of Pixel Region]

Figure 14:
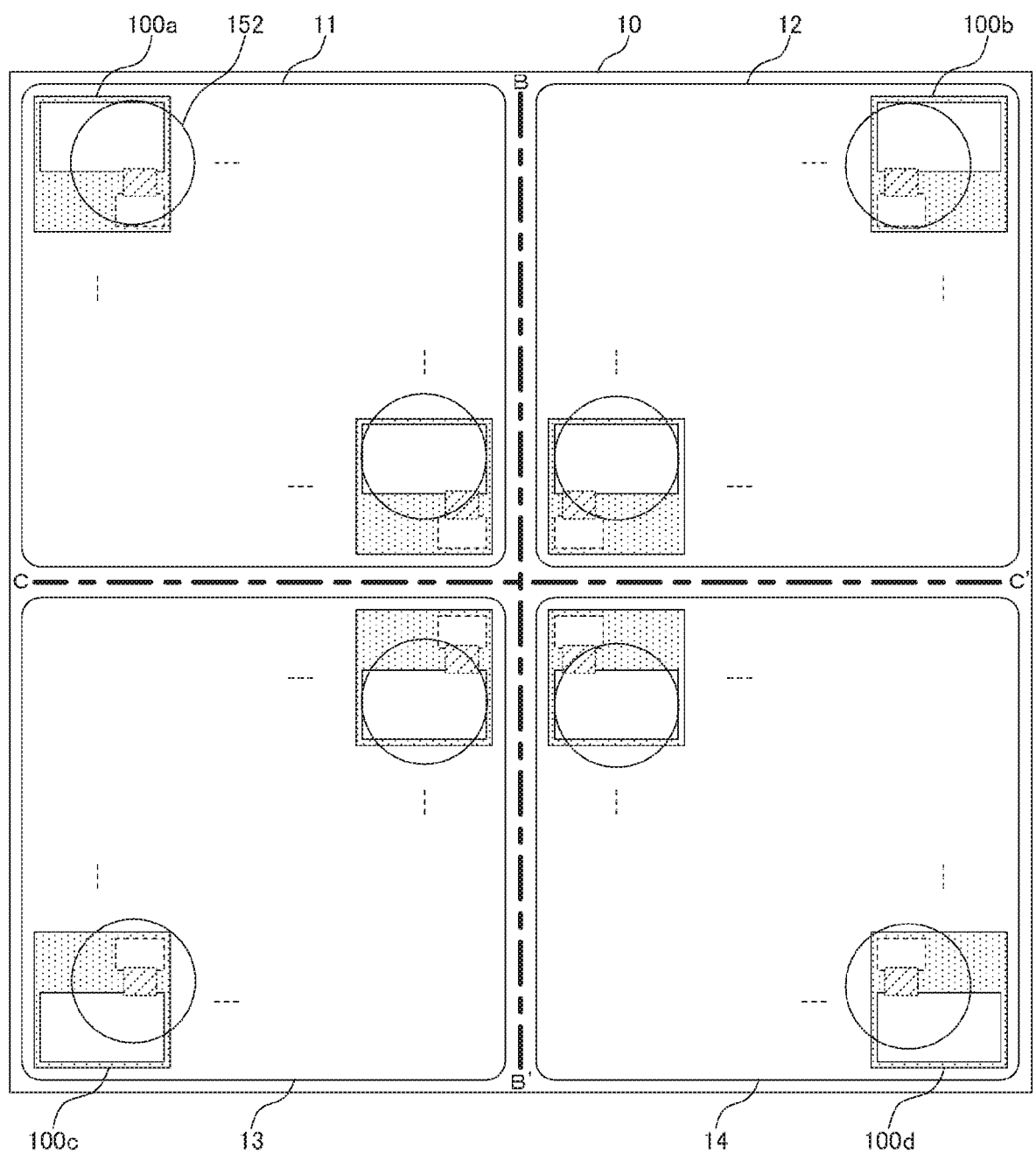
FIG. 14 illustrates a configuration example of a pixel region according to a fourth embodiment of the present technology.

FIG. 14 illustrates a configuration example of a pixel region according to the fourth embodiment of the present technology. The pixel 100 in the figure is different from the pixel array 10 described with reference to FIG. 5 in that the position of the on-chip lens 152 differs for each pixel 100. In the pixel 100 situated near the optical center, the on-chip lens 152 is arranged in a central portion of the photoelectric converter 101. On the other hand, in the pixel 100 arranged in the surrounding portion of the pixel array 10, the on-chip lens 152 is arranged in a state of being shifted closer to the optical center. As described above, incident light obliquely enters the pixel 100 in the surrounding portion of the pixel array 10. Thus, the on-chip lens 152 is arranged in a state of being shifted according to an incident angle of incident light. This makes it possible to collect incident light passing through the on-chip lens 152 into a region of the photoelectric converter 101, and thus to improve the efficiency in collecting light. Such a positional adjustment performed on the on-chip lens 152 is referred to as pupil correction.

Pupil correction results in improving the efficiency in collecting light in the pixel 100 arranged in the surrounding portion of the pixel array 10, and in more incident light entering the photoelectric converter 101. Thus, the charge holding section 102 or the charge transfer section 103 is arranged close to the optical center of the pixel array 10. This makes it possible to suppress entrance of incident light into the charge holding section 102, and thus to prevent a reduction in image quality that is caused due to the improvement in the efficiency in collecting light.

Except for the points described above, the imaging device 1 has a configuration similar to the configuration of the imaging device 1 described in the first embodiment of the present disclosure. Thus, the description is omitted.

As described above, in the imaging device 1 of the fourth embodiment of the present disclosure, it is possible to suppress entrance of incident light into the charge holding section 102 in the pixel 100 on which pupil correction is performed, and thus to prevent a reduction in image quality.

5. Fifth Embodiment

In the imaging device 1 of the second embodiment described above, the adjustment of the shape of a boundary of pixel regions prevents a reduction in image quality at the boundary of pixel regions. On the other hand, the imaging device 1 of a fifth embodiment of the present disclosure is different from the second embodiment described above in that a reduction in image quality is prevented by image processing being performed.

[Configuration of Imaging Device]

Figure 15:
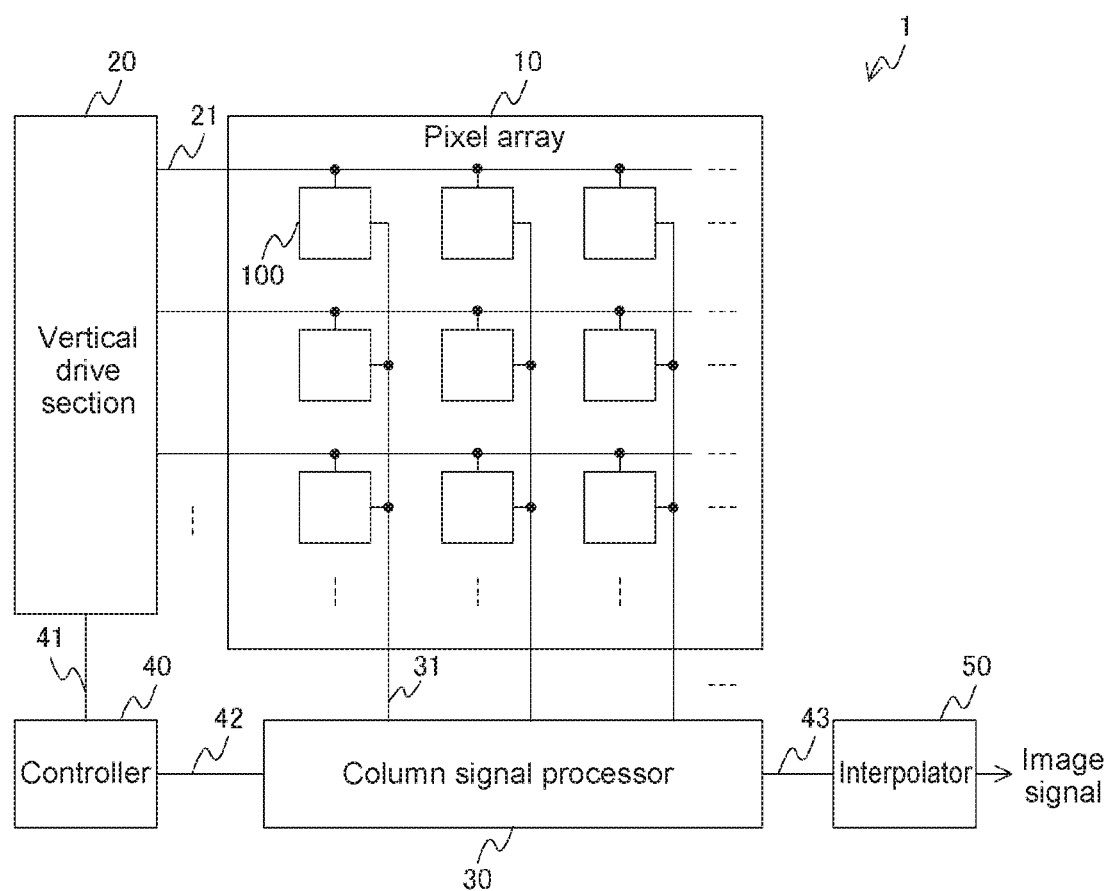
FIG. 15 illustrates a configuration example of an imaging device according to a fifth embodiment of the present technology.

FIG. 15 illustrates a configuration example of an imaging device according to the fifth embodiment of the present technology. The imaging device 1 in the figure is different from the pixel array 10 described with reference to FIG. 1 in further including an interpolator 50.

The interpolator 50 performs interpolation processing on an image signal. Here, the interpolation processing is processing of generating an image signal of a missing pixel from an image signal of an adjacent pixel. The interpolator 50 in the figure performs interpolation processing on a digital image signal output from the column signal processor 30, and generates an image signal of a virtual pixel 100 arranged at a boundary of pixel regions by performing interpolation. Note that the interpolator 50 is an example of a processing circuit according to an embodiment of the present disclosure.

[Interpolation Processing]

Figure 16:
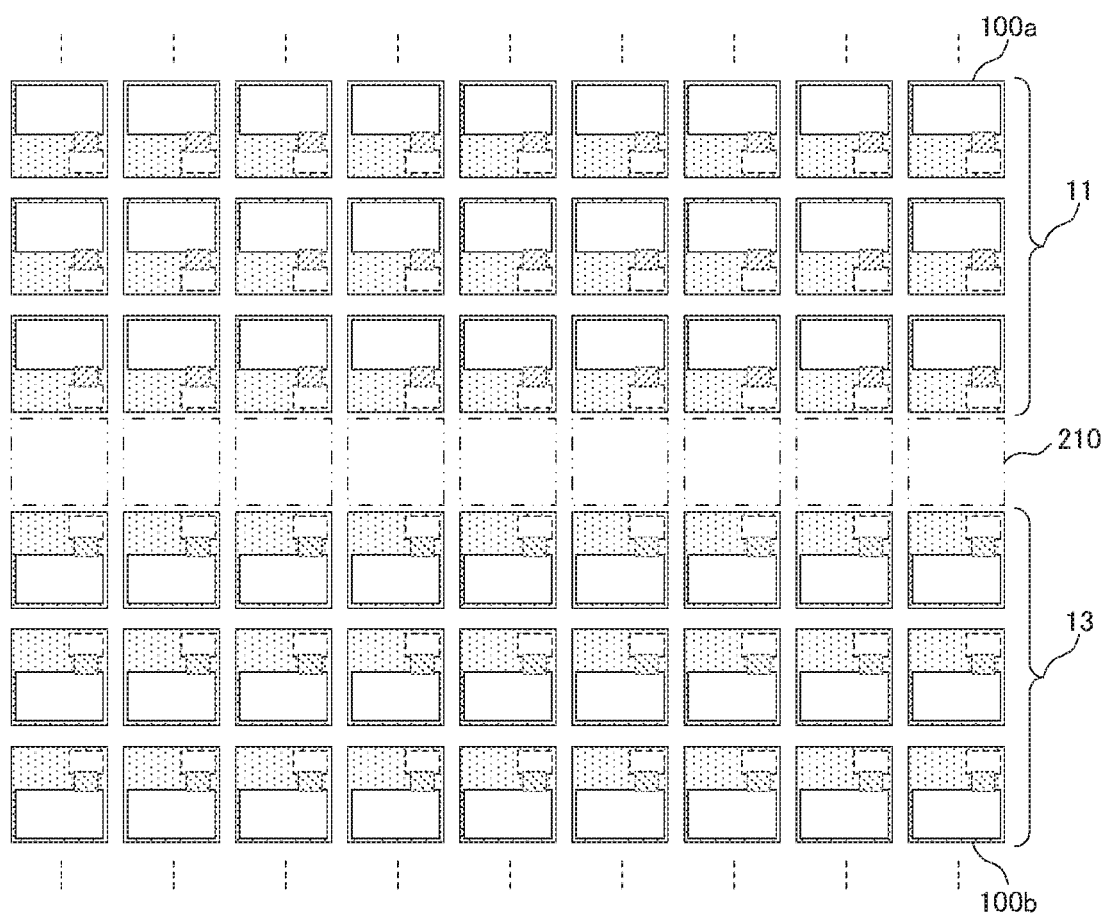
FIG. 16 illustrates an example of interpolation processing according to the fifth embodiment of the present technology.

FIG. 16 illustrates an example of interpolation processing according to the fifth embodiment of the present technology. The figure illustrates the pixel array 10 at a boundary of the pixel regions 11 and 13. A pixel 210 indicated with a dot-dot-dash line in the figure is a virtual pixel arranged at a boundary of the pixel regions 11 and 13. The interpolator 50 generates an image signal of the pixel 210 by performing interpolation processing. Specifically, the interpolator 50 performs operation with respect to image signals of the pixels 100 above and below the pixel 210, and outputs a result of the operation as an image signal of the pixel 210. For example, operation of calculating an average may be performed as such operation. This makes it possible to prevent a linear defect from occurring at a boundary of pixel regions.

Except for the points described above, the imaging device 1 has a configuration similar to the configuration of the imaging device 1 described in the second embodiment of the present disclosure. Thus, the description is omitted.

As described above, in the imaging device 1 of the fifth embodiment of the present disclosure, interpolation processing makes it possible to prevent a defect from occurring at a boundary of pixel regions in an image, and thus to prevent a reduction in image quality.

6. Example of Application to Camera

The present technology is applicable to various products. For example, the present technology may be implemented as an imaging device included in an image-capturing apparatus such as a camera.

Figure 17:
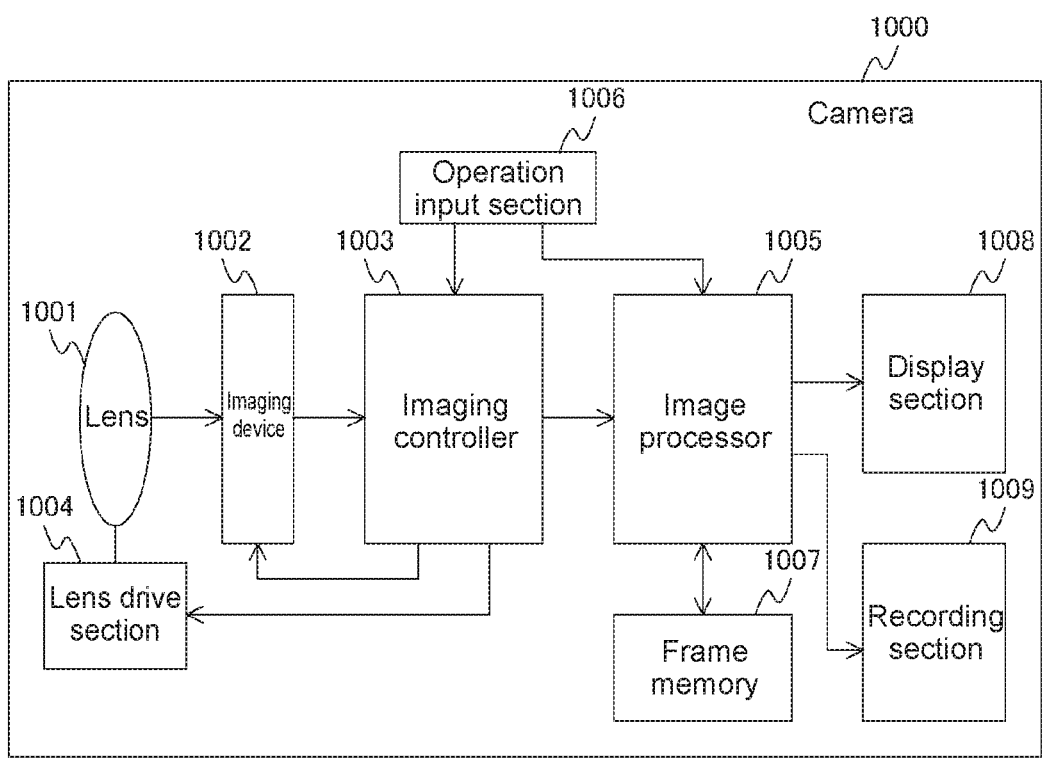
FIG. 17 is a block diagram illustrating an example of a schematic configuration of a camera that is an example of an image-capturing apparatus to which the present technology may be applied.

FIG. 17 is a block diagram illustrating an example of a schematic configuration of a camera that is an example of an image-capturing apparatus to which the present technology may be applied. A camera 1000 in the figure includes a lens 1001, an imaging device 1002, an imaging controller 1003, a lens drive section 1004, an image processor 1005, an operation input section 1006, a frame memory 1007, a display section 1008, and a recording section 1009.

The lens 1001 is an imaging lens of the camera 1000. The lens 1001 collects light from a subject, and causes the collected light to enter the imaging device 1002 described later to form an image of the subject.

The imaging device 1002 is a semiconductor device that images the light from the subject that is collected by the lens 1001. The imaging device 1002 generates an analog image signal depending on irradiated light, converts the analog image signal into a digital image signal, and outputs the digital image signal.

The imaging controller 1003 controls imaging performed by the imaging device 1002. The imaging controller 1003 performs control of the imaging device 1002 by generating a control signal and outputting the control signal to the imaging device 1002. Further, the imaging controller 1003 is capable of performing autofocusing in the camera 1000 on the basis of the image signal output from the imaging device 1002. Here, the autofocusing is a system that detects a focal position of the lens 1001 and automatically adjusts the focal position. It is possible to use, as the autofocusing, a method of detecting a focal position by detecting an image-plane phase difference using a phase difference pixel arranged in the imaging device 1002 (image-plane-phase-difference autofocusing). Further, it is also possible to apply a method of detecting, as the focal position, a position in which an image exhibits a highest contrast (contrast autofocusing). The imaging controller 1003 adjusts the position of the lens 1001 through the lens drive section 1004 on the basis of the detected focal position, and performs autofocusing. Note that the imaging controller 1003 can be implemented by, for example, a digital signal processor (DSP) that includes firmware.

The lens drive section 1004 drives the lens 1001 on the basis of control performed by the imaging controller 1003. The lens drive section 1004 is capable of driving the lens 1001 by changing the position of the lens 1001 using a built-in motor.

The image processor 1005 processes the image signal generated by the imaging device 1002. Examples of the processing include demosaicking that generates an image signal of a missing color from among image signals for respective pixels that respectively correspond to red, green, and blue; noise reduction that removes noise from an image signal; and encoding of an image signal. The image processor 1005 can be implemented by, for example, a microcomputer that includes firmware.

The operation input section 1006 receives an operation input from a user of the camera 1000. For example, it is possible to use a push button or a touch panel as the operation input section 1006. An operation input received by the operation input section 1006 is transmitted to the imaging controller 1003 and the image processor 1005. Thereafter, a process corresponding to the operation input such as a process of capturing an image of a subject, is started.

The frame memory 1007 is a memory that stores therein a frame that is an image signal for a single screen. The frame memory 1007 is controlled by the image processor 1005, and holds a frame in the process of image processing.

The display section 1008 displays thereon an image processed by the image processor 1005. For example, it is possible to use a liquid crystal panel for the display section 1008.

The recording section 1009 records therein an image processed by the image processor 1005. For example, it is possible to use a memory card or a hard disk as the recording section 1009.

The camera to which the present disclosure may be applied has been described above. The present technology may be applied to the imaging device 1002 from among the components described above. Specifically, the imaging device 1 described with reference to FIG. 1 is applicable to the imaging device 1002. The application of the imaging device 1 to the imaging device 1002 makes it possible to suppress entrance of incident light into the charge holding section 102, and thus to prevent a reduction in quality of an image generated by the camera 1000. Note that, instead of the interpolator 50 described with reference to FIG. 15, the image processor 1005 may perform interpolation processing. Note that the image processor 1005 is an example of the processing circuit.

Note that, although a camera has been described as an example, the technology according to the present disclosure may also be applied to, for example, a monitoring apparatus.

Finally, the descriptions of the respective embodiments above are examples of the present disclosure, and the present disclosure is not limited to the embodiments described above. Thus, various modifications may of course be made depending on the design and the like without departing from the technical idea according to the present disclosure even in the case of an embodiment other than the embodiments described above.

Note that the present technology may also take the following configurations.

(1) An imaging device, including
a pixel array that includes a pixel including a photoelectric converter that generates a charge depending on incident light, a charge holding section that holds the generated charge, and a charge transfer section that transfers the generated charge to the charge holding section, the pixel generating an image signal depending on the held charge, the pixel array including a plurality of the pixels, the charge holding section or the charge transfer section in each of the plurality of the pixels being arranged close to an optical center of the pixel array with respect to the incident light.

(2) The imaging device according to (1), in which
the pixel array includes a plurality of image regions each including a plurality of the pixels, and
at least one of the photoelectric converter, the charge holding section, or the charge transfer section in each of the plurality of the pixels in one of the plurality of image regions is arranged symmetrically to the at least one of the photoelectric converter, the charge holding section, or the charge transfer section in each of the plurality of the pixels in another of the plurality of image regions.

(3) The imaging device according to (2), in which
the plurality of image regions is adjacently arranged along a line passing through the optical center with respect to the incident light.

(4) The imaging device according to (3), in which
the plurality of image regions is adjacently arranged along a plurality of the lines each passing through the optical center with respect to the incident light.

(5) The imaging device according to any one of (1) to (4), in which
the pixel further includes a light-blocking wall that is arranged between the photoelectric converter and the charge holding section, and blocks the incident light, the light-blocking wall including an opening near the charge transfer section.

(6) The imaging device according to any one of (1) to (5), in which
the pixel further includes a second charge holding section that holds the transferred charge, and a second charge transfer section that transfers the charge held in the charge holding section to the second charge holding section, the pixel generating an image signal on the basis of the charge held in the second charge holding section.

(7) The imaging device according to any one of (2) to (6), in which
a boundary of the plurality of image regions has a shape different from a linear shape.

(8) The imaging device according to (7), in which
the boundary has an irregular shape having convex and concave portions, the convex or concave portion being provided for each pixel.

(9) The imaging device according to (7), in which
the boundary has a shape having convex and concave portions and being formed on the basis of a specified regulation, the convex or concave portion being provided for each pixel.

(10) The imaging device according to any one of (1) to (9), in which
each of the plurality of the pixels further includes an on-chip lens that collects the incident light into the photoelectric converter.

(11) The imaging device according to (10), in which
the on-chip lens is arranged in a state of being shifted with respect to the photoelectric converter according to an incident angle of the incident light.
(12) An image-capturing apparatus, including:
an imaging device that includes a pixel array that includes a pixel including a photoelectric converter that generates a charge depending on incident light, a charge holding section that holds the generated charge, and a charge transfer section that transfers the generated charge to the charge holding section, the pixel generating an image signal depending on the held charge, the pixel array including a plurality of the pixels, the charge holding section or the charge transfer section in each of the plurality of the pixels being arranged close to an optical center of the pixel array with respect to the incident light; and
a processing circuit that processes the generated image signal.
(13) The image-capturing apparatus according to (12), in which
the processing circuit performs processing of generating a new image signal on the basis of an image signal of the pixel arranged near a boundary of the plurality of regions.

REFERENCE SIGNS LIST 1 imaging device
10 pixel array
11 to 16 pixel region
20 vertical drive section
30 column signal processor
40 controller
50 interpolator
100, 100a, 100b, 100c, 100d, 100e, 100f, 100g, 100h pixel
101 photoelectric converter
102 charge holding section
103 charge transfer section
104 reset section
107 second charge holding section
108 overflow gate
109 second charge transfer section
110 image signal generator
121 semiconductor substrate
124 insulation film
125 light-blocking wall
126, 128 opening
127 light-blocking film
131 insulation layer
135 wiring layer
151 color filter
152 on-chip lens
1002 imaging device
1005 image processor

What is claimed is:
1. An imaging device, comprising:
a semiconductor substrate; and
a pixel array including a plurality of pixels, each pixel including:
a photoelectric converter that generates a charge depending on incident light;
a charge holding section that holds the generated charge;
a charge transfer section that transfers the generated charge to the charge holding section;
an insulating film; and
a light-blocking wall arranged perpendicularly between the photoelectric converter and the charge holding section, wherein the light-blocking wall is disposed within the insulating film, and wherein a portion of the light-blocking wall is shorter in a depth direction than another portion of the light-blocking wall, forming an opening in the insulation film and the light-blocking wall between the photoelectric converter and the charge holding section.

2. The imaging device according to claim 1,
wherein the pixel array includes a plurality of image regions, and wherein at least one of the photoelectric converter, the charge holding section, or the charge transfer section in each of the plurality of pixels in one of the plurality of image regions is arranged symmetrically to the at least one of the photoelectric converter, the charge holding section, or the charge transfer section in each of the plurality of pixels in another of the plurality of image regions.

3. The imaging device according to claim 2,
wherein the plurality of image regions are adjacently arranged along a line passing through an optical center with respect to the incident light.

4. The imaging device according to claim 3,
wherein the plurality of image regions are adjacently arranged along a plurality of lines each passing through the optical center with respect to the incident light.

5. The imaging device according to claim 1, wherein each pixel further includes a second charge holding section that holds the transferred charge, and a second charge transfer section that transfers the charge held in the charge holding section to the second charge holding section, each pixel generating an image signal on a basis of the charge held in the second charge holding section.

6. The imaging device according to claim 2,
wherein a boundary of the plurality of image regions has a shape different from a linear shape.

7. The imaging device according to claim 6, wherein the boundary has an irregular shape having convex and concave portions, the convex or concave portions being provided for each pixel.

8. The imaging device according to claim 6, wherein the boundary has a shape having convex and concave portions and being formed on a basis of a specified regulation, the convex or concave portions being provided for each pixel.

9. The imaging device according to claim 1, wherein each pixel further includes an on-chip lens that collects the incident light into the photoelectric converter.

10. The imaging device according to claim 9, wherein the on-chip lens is arranged in a state of being shifted with respect to the photoelectric converter according to an incident angle of the incident light.

11. An image-capturing apparatus, comprising:
an imaging device that includes a pixel array that includes a plurality of pixels, each pixel including:
a photoelectric converter that generates a charge depending on incident light;
a charge holding section that holds the generated charge;
a charge transfer section that transfers the generated charge to the charge holding section, the pixel generating an image signal depending on the held charge;
an insulating film; and
a light-blocking wall arranged perpendicularly between the photoelectric converter and the charge holding section, wherein the light-blocking wall is disposed within the insulating film, and wherein a portion of the light-blocking wall is shorter in a depth direction than another portion of the light-blocking wall. forming an opening in the insulation film and the light-blocking wall between the photoelectric converter and the charge holding section; and
a processing circuit that processes the generated image signal.

12. The image-capturing apparatus according to claim 11, wherein the processing circuit performs processing of generating a new image signal on a basis of an image signal of a pixel arranged near a boundary of a plurality of regions.

* * * * *